United States Patent
Kadotani et al.

(10) Patent No.: US 6,347,521 B1
(45) Date of Patent: Feb. 19, 2002

(54) TEMPERATURE CONTROL DEVICE AND METHOD FOR MANUFACTURING THE SAME

(75) Inventors: Kanichi Kadotani; Makio Tsubota; Hironori Akiba; Tadayuki Hanamoto, all of Kanagawa (JP)

(73) Assignee: Komatsu LTD, Tokyo (JP)

( * ) Notice: Subject to any disclaimer, the term of this patent is extended or adjusted under 35 U.S.C. 154(b) by 0 days.

(21) Appl. No.: 09/685,805

(22) Filed: Oct. 11, 2000

(30) Foreign Application Priority Data

Oct. 13, 1999 (JP) .......................... 11-291018

(51) Int. Cl.⁷ .................... F25B 21/02; H01L 35/28
(52) U.S. Cl. ............................... 62/3.7; 136/204
(58) Field of Search ................. 62/3.2, 3.3, 3.7; 136/203, 204, 225

(56) References Cited

U.S. PATENT DOCUMENTS

| | | | | |
|---|---|---|---|---|
| 4,420,364 A | * | 12/1983 | Nukii et al. ............... | 156/631 |
| 4,735,847 A | * | 4/1988 | Fujiwara et al. .......... | 428/209 |
| 5,588,300 A | * | 12/1996 | Larsson et al. ........... | 62/3.61 |
| 5,605,048 A | * | 2/1997 | Kozlov et al. ............ | 62/3.7 |
| 5,737,923 A | * | 4/1998 | Gilley et al. ............. | 62/3.7 |
| 5,802,856 A | * | 9/1998 | Schaper et al. ........... | 62/3.7 |
| 5,956,569 A | * | 9/1999 | Shiu et al. ................ | 438/48 |
| 6,000,225 A | * | 12/1999 | Ghoshal .................... | 62/3.7 |
| 6,096,965 A | * | 8/2000 | Ghamaty et al. .......... | 136/201 |

* cited by examiner

Primary Examiner—William C. Doerrler
(74) Attorney, Agent, or Firm—Arm strong, Westerman, Hat tori, .McLeland & N aughton, LLP.

(57) ABSTRACT

The invention provides a temperature control device with excellent temperature uniformity and thermal response, which can be manufactured easily, and a manufacturing method for the same. A thermoelectric device 21 is arranged between a substrate mounting plate 1 and a cooling plate 3. Copper foil electrodes 5, 5, . . . on the upper side of the thermoelectric device 21 are adhered to a lower surface of the substrate mounting plate 1 with an adhesive sheet 17 covering substantially the entire lower surface of the substrate mounting plate 1, and copper foil electrodes 7, 7, . . . on the lower side of the thermoelectric device 21 are adhered to an upper surface of the cooling plate 3 with an adhesive sheet 19 covering substantially the entire upper surface of the substrate mounting plate 1. The total thickness of the adhesive sheet 17 and the copper foil electrodes 5 adhering to it, and the total thickness of the adhesive sheet 19 and the copper foil electrodes 7 adhering to it, is each set approximately 25 to 1000 $\mu$m thin, so as to make the thermal resistance sufficiently low. Thermoelectric conversion elements 9 and 13 are distributed across a large area covering at least the entire area corresponding to the substrate 2.

17 Claims, 19 Drawing Sheets

TEMPERATURE CONTROL DEVICE AND METHOD FOR MANUFACTURING THE SAME

BACKGROUND OF THE INVENTION

1. Field of the Invention

The present invention relates to a temperature control device that is suitable for the temperature control of substrates, such as semiconductor wafers, and in particular, to the improvement of a temperature control device using a semiconductor heat exchange device utilizing the Peltier effect and a method for manufacturing the same.

2. Description of the Related Art

Conventionally, temperature control devices for controlling the temperature of substrates, such as semiconductor wafers, are known that are provided with a semiconductor thermoelectric conversion module (referred to as "thermoelectric module" in the following) utilizing the Peltier effect as a means for heating or cooling. In such temperature control devices, thermoelectric modules are sandwiched between a plate for mounting the object to be temperature-controlled and a plate for heat exchange. Usually, the thermoelectric modules are two-dimensional arrangements of a multitude of rectangular solid-shaped p-type semiconductor elements and n-type semiconductor elements, which are coupled to π-shapes by electrodes and electrically connected in series, sandwiched between two rectangular ceramic plates. When current flows through the thermoelectric modules, due to the Peltier effect, the surface (heat exchange surface) of the ceramic plate on one side absorbs heat, whereas the surface (heat exchange surface) of the ceramic plate on the other side releases heat.

When for example cooling the object to be temperature-controlled with this temperature control device, the thermoelectric modules are driven so as to absorb heat on the side of the mounting plate and to release heat on the heat exchange plate. Then, the heat exchange plate takes away the heat from the thermoelectric modules, for example with cooling water flowing inside it.

This type of conventional temperature control device is manufactured as follows. First, depending on the size of the temperature control device, a number of thermoelectric modules is prepared. Since one thermoelectric module has a size of not more than several cm by several cm, a multitude of thermoelectric modules are necessary to produce a temperature control device for a wafer of, for example, 30 cm diameter, because the diameter of the temperature control device exceeds those 30 cm. Then, thermally conducting grease is applied to both heat exchange surfaces of the thermoelectric modules. Then, the thermoelectric modules are sandwiched between the mounting plate and the heat exchange plate, and the thermoelectric modules are pressed against the two plates by applying pressure to the outside surfaces of the two plates. Then, while pressing the thermoelectric modules against the two plates, the two plates are fastened to one another with a plurality of bolts, fixing the positions of the thermoelectric modules between the two plates. Fastening the bolts, the plates and the thermoelectric modules are pressed against each other with a large force, so that the plates and the thermoelectric modules are in close contact and a sufficiently large contact area between the plates and the thermoelectric modules can be ensured even when there are slight irregularities in the surface of the plates.

However, in this conventional method for manufacturing a temperature control device, there is the problem that the steps for fastening the bolts make the method labor-intensive. Moreover, when the bolts are tightened too much, the plates may be inadvertently deformed. Furthermore, when there are variations in the tightening degree of the individual bolts, then there is the danger of deficiencies such as positional misalignments of the thermoelectric modules, or the projecting of the thermoelectric modules from between the plates. Moreover, when the positions where the plates can be attached to the bolts are restricted due to the strength of the plates and the arrangement of the water ducts in the heat exchange plate, then this also puts limitations to the positions where the thermoelectric modules can be attached, and as a result, there are the problems that irregularities occur in the temperature distribution in the surface of the mounting plate, and that the capability to adjust all portions of the object to be temperature-controlled to the same temperature, that is, the temperature uniformity worsens. Moreover, in the conventional temperature control device, ceramic plates are inserted between the thermoelectric modules and the plates for electric insulation between those parts, so that these ceramic plates act as heat resistances, and in particular due to the heat resistance of the ceramic plate on the side of the mounting plate, it is not possible to achieve a sufficient thermal response with respect to the object to be temperature-controlled. Therefore, it is not possible to adjust the temperature of the object to be temperature-controlled quickly to the desired temperature.

SUMMARY OF THE INVENTION

It is therefore an object of the present invention to provide a temperature control device with excellent temperature uniformity and thermal response, which can be manufactured easily, and a manufacturing method for the same.

A temperature control device in accordance with the present invention includes a mounting plate for mounting an object to be temperature-controlled; a heat exchange plate for the exchange of heat; a heat exchange device having a multitude of thermoelectric conversion elements that are sandwiched between said two plates and arranged in a two-dimensional arrangement, and a multitude of electrodes that are electrically connected to these thermoelectric conversion elements and that have heat exchange surfaces on both sides. The multitude of thermoelectric conversion elements of the heat exchange device is distributed across substantially an entire temperature control region that covers the region corresponding to the object to be temperature-controlled that is mounted on the mounting plate.

With this invention, the thermoelectric conversion elements can be distributed densely across the entire temperature control region that covers the region corresponding to the object to be temperature-controlled, so that temperature uniformity can be attained reliably.

In a preferable embodiment, all of the thermoelectric conversion elements included in the heat exchange device are connected electrically in series. Moreover, the electrodes are made of metal foil, for instance, copper foil or stainless steel foil.

In a preferable embodiment, the heat exchange surfaces on at least one side of the heat exchange device are fixed to the mounting plate or the heat exchange plate with an adhesive. The adhesive is electrically insulating, and the heat exchange surfaces on at least one side of the heat exchange device are directly adhered to the mounting plate or the heat exchange plate with this adhesive. The total thickness of the adhesive and the electrodes on the side that is fixed with the adhesive is approximately 25 to 100 μm.

In a preferable embodiment, the surface of the mounting plate or the heat exchange plate is coated with an insulating material, and the heat exchange surfaces on at least one side of the heat exchange device are adhered to this coated surface.

In a preferable embodiment, the heat exchange surfaces on at least one side of the heat exchange device are attached in a slidable manner to the mounting plate or the heat exchange plate, and the heat exchange surfaces on the other side of the heat exchange device are fixed to the mounting plate or the heat exchange plate. The heat exchange surfaces on the other side are directly adhered to the mounting plate or the heat exchange plate with an adhesive that is electrically insulating. More preferably, the heat exchange surfaces on one side of the heat exchange device are slidable with respect to the heat exchange plate, and the heat exchange surfaces on the other side are adhered to the mounting plate with the adhesive.

In a preferable embodiment, the mounting plate is a flexible sheet.

In a preferable embodiment, a plurality of the heat exchange devices are stacked one upon the other with the heat exchange surfaces arranged in series. In this case, the plurality of the heat exchange devices are adhered to one another with an electrically insulating adhesive.

A preferable embodiment further includes a reinforcement material provided between the mounting plate and the heat exchange plate. This reinforcement material can be a lattice-shaped member, electrically insulating the thermoelectric conversion elements included in the heat conversion device.

A preferable embodiment further includes a jig for arranging the thermoelectric conversion elements of the heat exchange device between the mounting plate and the heat exchange plate.

A preferable embodiment further includes a duct for cooling water inside the heat exchange plate.

In a preferable embodiment, the mounting plate is a heat plate provided with one or more heat pipes.

A method for manufacturing a temperature control device in accordance with a first aspect of the present invention includes a first step of adhering a metal foil to a surface of an adhesive sheet; a second step following the first step, in which a pattern is etched into the metal foil on the surface of the adhesive sheet, so as to form electrodes having a predetermined wiring pattern; a third step following the second step, in which the adhesive sheet is adhered to one surface of the mounting plate or the heat exchange plate; and a fourth step following the second step, in which the thermoelectric conversion elements are connected to predetermined positions on the metal foil electrodes.

A method for manufacturing a temperature control device in accordance with a second aspect of the present invention includes a first step of adhering a metal foil to a surface of an adhesive sheet; a second step of adhering the adhesive sheet to one surface of the mounting plate or the heat exchange plate; a third step following the first step and the second step, in which a pattern is etched into the metal foil on the adhesive sheet, so as to form electrodes having a predetermined pattern on the adhesive sheet; a fourth step following the third step, in which the thermoelectric conversion elements are connected to predetermined positions on the metal foil electrodes.

In a preferable embodiment, the adhesion with the adhesive sheet is carried out by heating the adhesive sheet and fusing it.

In a preferable embodiment, when electrically connecting the thermoelectric conversion elements, a jig for attaching the thermoelectric conversion elements is used that has through holes for setting the thermoelectric conversion elements, wherein the through holes are formed in accordance with the pattern in which the thermoelectric conversion elements are arranged.

DESCRIPTION OF THE PREFERRED EMBODIMENTS

The following is a more detailed description of the preferred embodiments of the present invention, with reference to the drawings.

Figure 1:
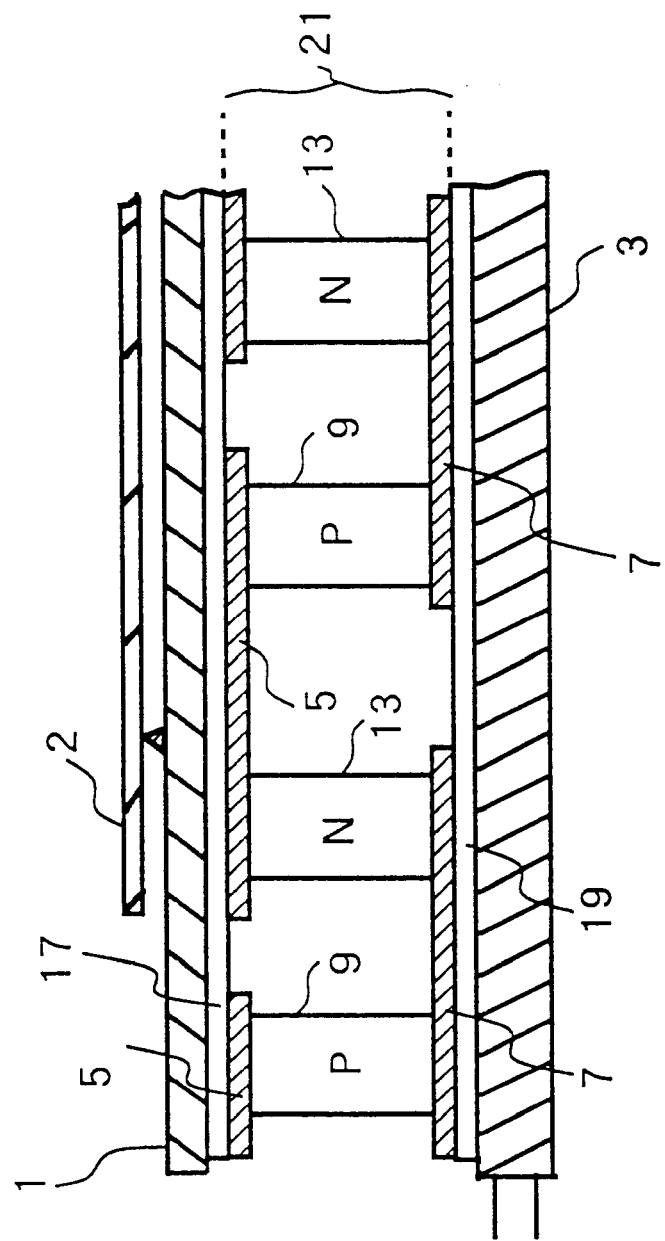
FIG. 1 shows the cross-sectional structure of a temperature control device in accordance with a first embodiment of the present invention.

FIG. 1 is a diagram showing the cross-sectional structure of a temperature control device in accordance with a first embodiment of the present invention. There is no particular limitation with regard to the shape etc. of the object to be temperature-controlled with this temperature control device, and typical examples of such an object include semiconductor wafers or substrates, such as liquid crystal substrates.

As shown in FIG. 1, this temperature control device includes a substrate mounting plate 1 for mounting a substrate 2 to be temperature-controlled, a cooling plate 3 through which cooling water flows, and a semiconductor thermoelectric conversion device 21 (referred to as "thermoelectric device" in the following) using the Peltier effect, which is sandwiched between the two plates 1 and 3. The thermoelectric device 21 includes a multitude of copper foil electrodes 5, 5, . . . adhering to a lower surface of the substrate mounting plate 1, a multitude of copper foil electrodes 7, 7, . . . adhering to an upper surface of the cooling plate 3, a multitude of rectangular solid-shaped p-type semiconductor elements (thermoelectric conversion elements) 9, 9, . . . , and n-type semiconductor elements (thermoelectric conversion elements) 13, 13, . . . , that are connected between the upper copper foil electrodes 5, 5, . . . , and the lower electrodes 7, 7, . . . . The upper electrodes 5, 5, . . . and the lower electrodes 7, 7, . . . of the thermoelectric device 21 are adhered to the lower surface of the substrate mounting plate 1 and the upper surface of the cooling plate 3, respectively, with two adhesive sheets 17 and 19, that cover the lower surface of the substrate mounting plate 1 and the upper surface of the cooling plate 3, respectively. That is to say, the upper electrodes 5, 5, . . . and the lower electrodes 7, 7, . . . of the thermoelectric device 21 (that is, the upper and lower heat exchange surfaces) are directly adhered to the plates 1 and 3 with adhesive sheets 17 and 19. For convenience, FIG. 1 shows only two each of the p-type semiconductor elements 9, 9, . . . and the n-type semiconductor elements 13, 13, . . . but there is actually a multitude in the order of hundreds of p-type semiconductor elements 9, 9, . . . and n-type semiconductor elements 13, 13, . . . .

The substrate mounting plate 1 shown in FIG. 1 is made, for example, of aluminum, ceramics or a plurality of metals (rigid material), as in a compound metal substrate. As mentioned above, a semiconductor wafer or a substrate, such as a liquid crystal substrate, is placed on the upper surface of the substrate mounting plate 1 as the object to be temperature-controlled. Also the cooling plate 3 is made, for example, of aluminum, ceramics or a plurality of metals (rigid material), as in a compound metal substrate. Inside the cooling plate 3, ducts (cooling water pipes) for conducting cooling water, are arranged, so that cooling water can be circulated to substantially all regions of the cooling plate 3.

As mentioned above, the thermoelectric device 21 is sandwiched between the substrate mounting plate 1 and the cooling plate 3. The thermoelectric device 21 is configured as follows. π-shaped units are formed, in which one p-type semiconductor element 9 and one n-type semiconductor element 13 are soldered to each of the electric foil electrodes 5, 5, . . . on the upper side. Then, the p-type semiconductor elements 9 and the n-type semiconductor elements 13 of the neighboring π-shaped unit are soldered to the copper foil electrodes 7, 7, . . . on the lower side. Thus, the multitude of p-type semiconductor elements 9, 9, . . . and n-type semiconductor elements 13, 13, . . . are electrically connected in series by the upper and lower electrodes 5, 5, . . . , and 7, 7, . . . . Then, when direct current flows through this serially connected unit (that is, the thermoelectric device 21) of p-type semiconductor elements 9, 9, . . . and n-type semiconductor elements 13, 13, . . . , heat is absorbed by the surfaces on the side of the upper electrodes 5, 5, . . . (upper heat exchange surfaces) and released by the surfaces on the side of the lower electrodes 7, 7, . . . (lower heat exchange surfaces) or absorbed by the lower heat exchange surface and released to the upper heat exchange surface, depending on the current direction. To be specific, in the electrodes in which direct current flows from the p-type semiconductor element 9 to the n-type semiconductor elements 13, heat is absorbed due to the Peltier effect, whereas in the electrodes in which direct current flows from n to p, heat is released. As a result, when current flows from right to left in FIG. 1, heat is transferred from the substrate mounting plate 1 to the cooling plate 3, and conversely, when current flows from left to right in FIG. 1, heat is transferred from the cooling plate 3 to the substrate mounting plate 1. In this embodiment, the semiconductor elements 9, 9, . . . and 13, 13, . . . constituting the thermoelectric device 21 are electrically connected in series, but it is also possible to divide the semiconductor elements 9, 9, . . . and 13, 13, . . . into several groups, connect the elements within each group in series and connect the groups themselves in parallel, or provide the groups electrically independent from one another.

The upper copper foil electrodes 5, 5, . . . are adhered to the lower surface of the substrate mounting plate 1 with an adhesive sheet 17 covering substantially the entire lower surface of the plate 1. Similarly, the lower copper foil electrodes 7, 7, . . . are adhered to the upper surface of the cooling plate 3 with an adhesive sheet 19 covering substantially the entire upper surface of the plate 3. The adhesive sheets 17 and 19 are not only for the adhesion, but also for providing electrical insulation.

For the adhesive sheets 17 and 19, a material is used that is electrically insulating, heat-resistant and adhesive, such as a polyimide resin, and shaped into a film. The adhesive sheets 17 and 19 made of a polyimide resin, for example, have the quality that they can be fused to material contacting them by applying temperatures of about 200 to 300° C. Utilizing this quality, the adhesive sheet 17 is adhered at this fusing temperature to the lower surface of the substrate mounting plate 1, and the adhesive sheet 19 is adhered to the upper surface of the cooling plate 3, as mentioned above. Furthermore, the upper electrodes 5, 5, . . . are adhered to the lower surface of the adhesive sheet 17, and the lower electrodes 7, 7, . . . are adhered to the upper surface of the adhesive sheet 19. The total thickness of the adhesive sheet 17 and the copper foil electrodes 5 adhering to it, and the total thickness of the adhesive sheet 19 and the copper foil electrodes 7 adhering to it, is each set approximately 25 to 1000 μm thin, so as to make the thermal resistance sufficiently low.

Figure 2:
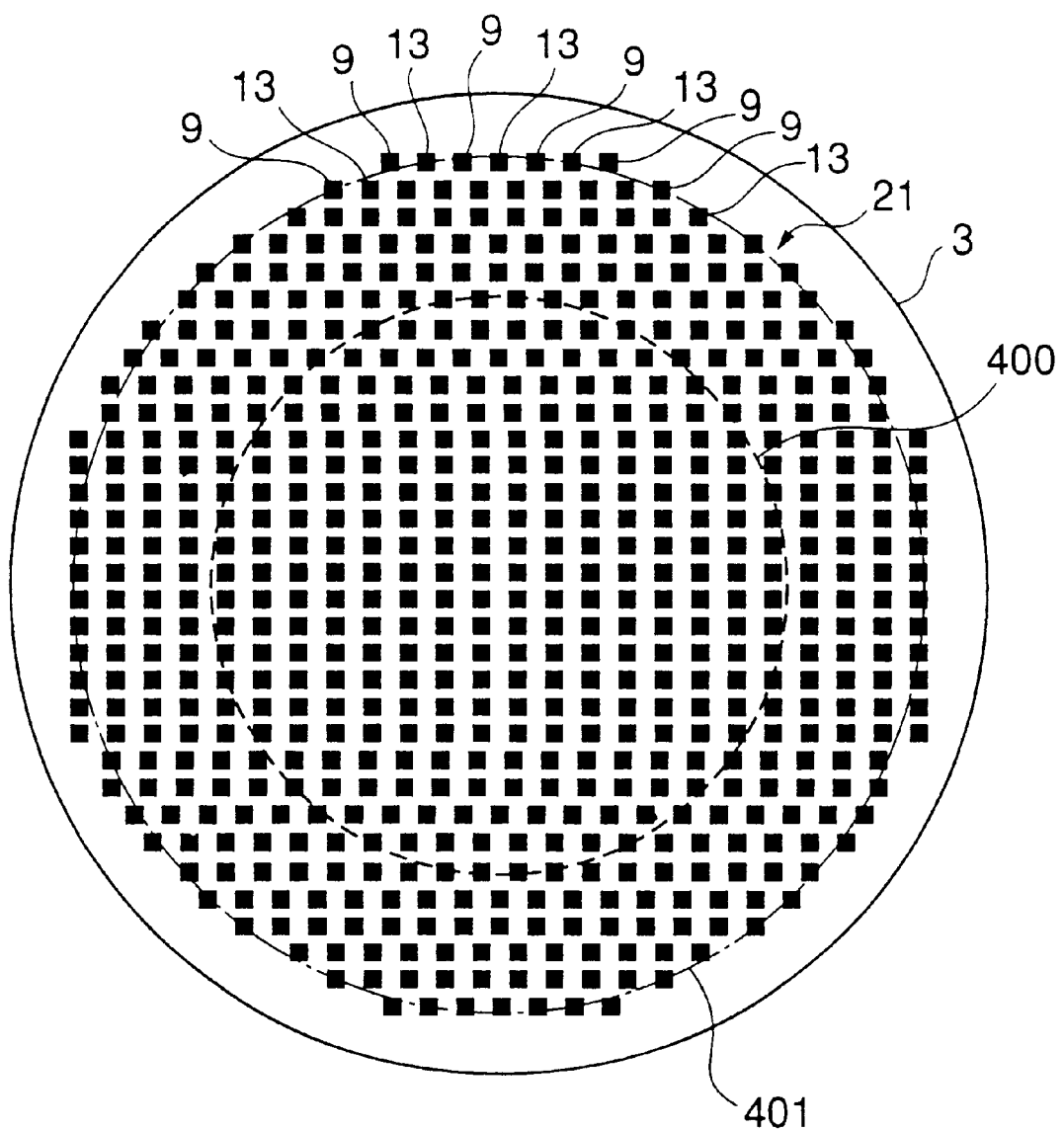
FIG. 2 is a planar view showing the planar arrangement of the p-type and n-type semiconductor elements (thermoelectric conversion elements) 9 and 13 of the thermoelectric device 21 of the temperature control device in FIG. 1.

FIG. 2 is a planar view showing the planar arrangement of the p-type and n-type semiconductor elements (thermoelectric conversion elements) 9 and 13 of the thermoelectric device 21 of this temperature control device.

Figure 3:
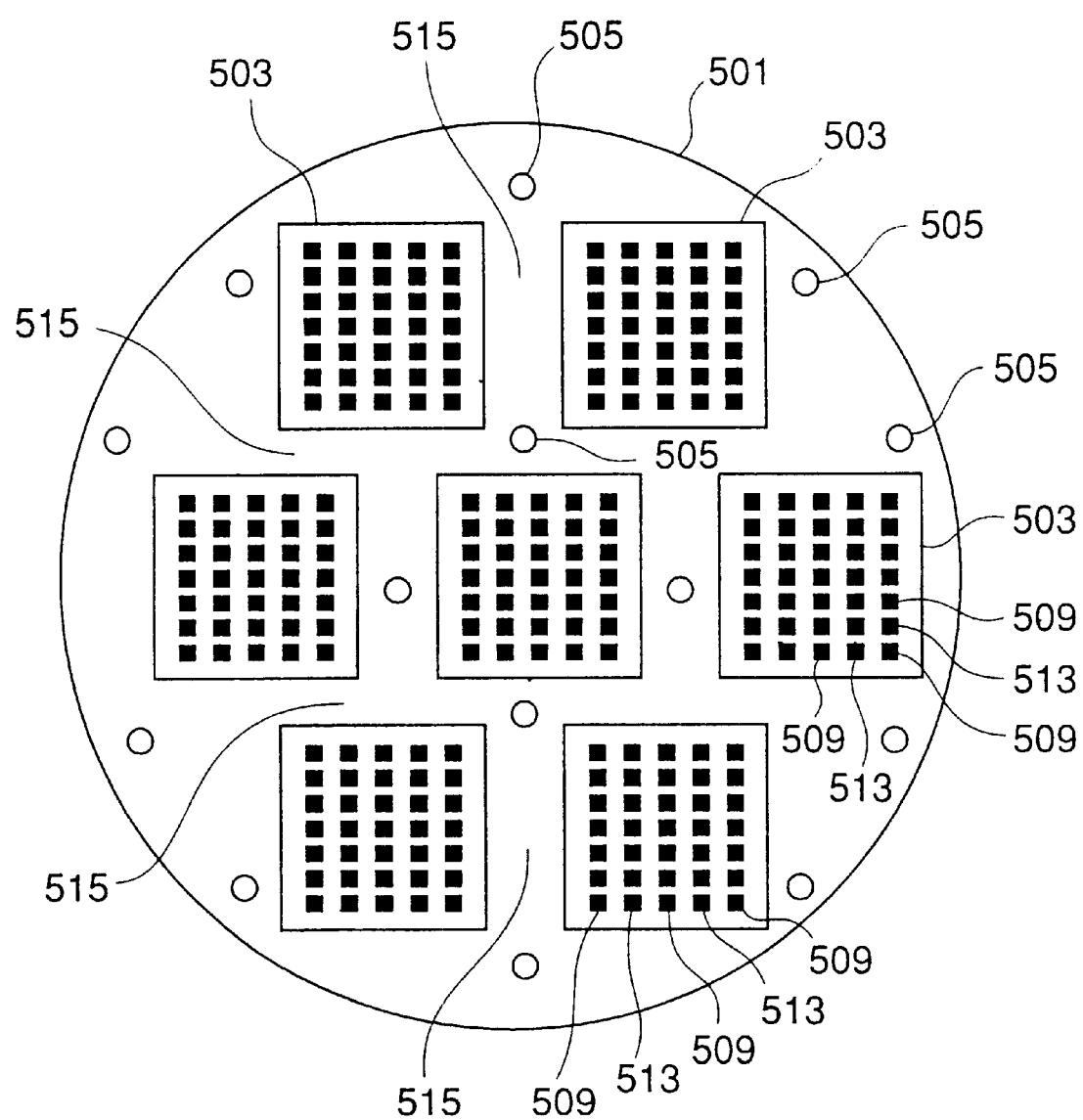
FIG. 3 shows an example of the planar arrangement of the thermoelectric conversion elements of a conventional temperature control device.

In FIG. 2, the circular region 400 indicated by the dashed line indicates the region corresponding to the substrate 2 serving as the object to be temperature-controlled, which is placed on the substrate mounting plate 1 (same region as the cooling plate 3 in FIG. 2). As shown in this drawing, thermoelectric conversion elements 9 and 13 are distributed across a broad temperature control region 401, covering at least the entire region 400 corresponding to the substrate. For comparison, FIG. 3 shows an example of the planar arrangement of the thermoelectric conversion elements of a conventional temperature control device. As has been explained in the section DESCRIPTION OF THE RELATED ART, a plurality of rectangular thermoelectric modules 503, 503, . . . are arranged on a cooling plate 501, and these thermoelectric modules 503, 503, . . . are fixed by fastening a plurality of bolts 505, 505 . . . . There are thermoelectric conversion elements 509 and 513 in the regions of the thermoelectric modules 503, but there are no thermoelectric conversion elements 509 and 513 at all in the regions 515 between the thermoelectric modules 503. As becomes clear by comparing FIGS. 2 and 3, the temperature control device of the present invention shown in FIG. 2 attains more uniform temperatures than the conventional device in FIG. 3.

Figure 4:
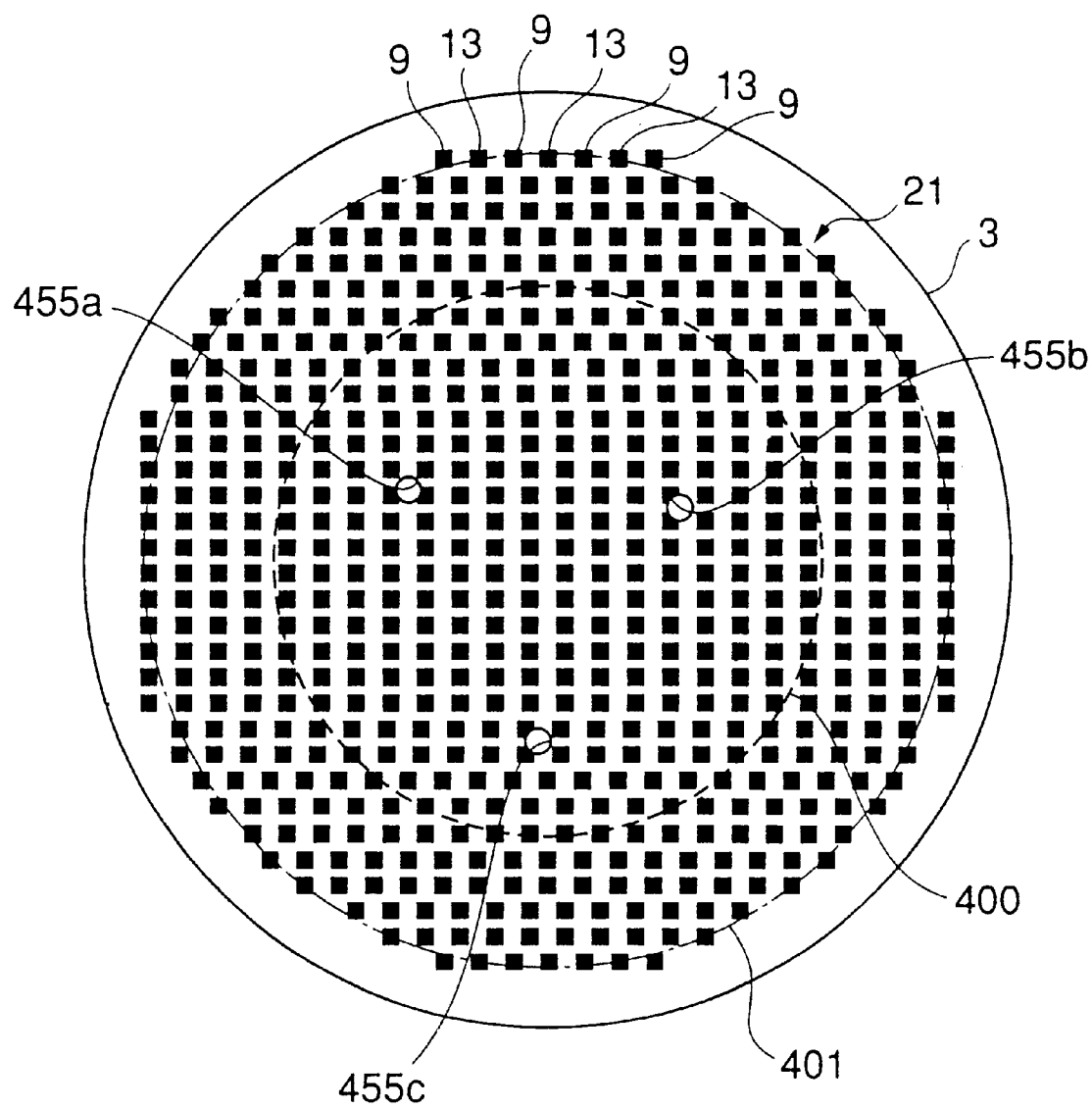
FIG. 4 is a planar view of the temperature control device when lifting pins for lifting and lowering the substrate 2 to be temperature-controlled on the temperature control device are provided.

As shown in FIG. 4, it is sometimes necessary to provide the temperature control device of the present invention in the substrate region 400 with pin holes 455a, 455b and 455c for passing lifting pins for lifting and lowering the substrate 2 to be subjected to temperature control. Thus, there are cases where the density and spacing of the thermoelectric conversion elements 9 and 13 changes depending on the position and where there are several thermoelectric conversion elements 9 and 13 missing even though the thermoelectric conversion elements 9 and 13 are distributed so as to cover the entire region 400 corresponding to the substrate, but the thermoelectric conversion elements 9 and 13 are still distributed much more densely over the entire region 400 corresponding to the substrate than in conventional temperature control devices, so that an excellent temperature uniformity can be attained reliably.

There are several aspects in the method of manufacturing this temperature control device that make it possible to distribute the thermoelectric conversion elements 9 and 13 in this manner over the entire region 400 corresponding to the substrate in the temperature control device of the present invention.

The following is an explanation of methods of manufacturing a temperature control device in accordance with the present invention as shown in FIGS. 1 and 2. Depending on the order in which the pattern of the electrodes 5 and 7 of the thermoelectric device 21 is patterned and adhered to the plates 1 and 3, these manufacturing methods can be classified broadly into two methods.

Firstly, a first manufacturing method is explained.

First of all, broad copper foils are adhered on the surface of the polyimide adhesive sheets 17 and 19, with a method that fuses the adhesive sheets 17 and 19, such as heat pressing. Then, the copper foil electrodes 5, 5, . . . and 7, 7, . . . are formed on the surface of the adhesive sheets 17 and 19 by etching a pattern into the copper foils on the surfaces of the adhesive sheets 17 and 19.

Then, the adhesive sheet 17, on whose surface the electrodes 5, 5, . . . have been adhered is adhered to the entire region of the lower surface of the substrate mounting plate 1, and the adhesive sheet 19, on whose surface the electrodes 7, 7, . . . have been adhered is adhered to substantially the entire region of the upper surface of the cooling plate 3, with a method that fuses the adhesive sheets 17 and 19, such as heat pressing.

When this step is finished, the p-type semiconductor elements 9, 9, . . . and the n-type semiconductor elements 13, 13, . . . are soldered to predetermined locations on the copper foil electrodes 5, 5, . . . . Then, the elements 9, 9, . . . and 13, 13, . . . that have been soldered onto the copper foil electrodes 5, 5, . . . are soldered to predetermined locations on the lower copper foil electrodes 7, 7, . . . . Finishing this step terminates the manufacturing process of the temperature control device. It is also possible to solder the semiconductor elements 9, 9, . . . and 13, 13, . . . to the electrodes 5, 5, . . . and 7, 7, . . . before adhering the adhesive sheets 17 and 19 to the plates 1 and 3.

The following is an explanation of a second manufacturing method, with reference to FIGS. 5(a) to (d).

Figure 5:
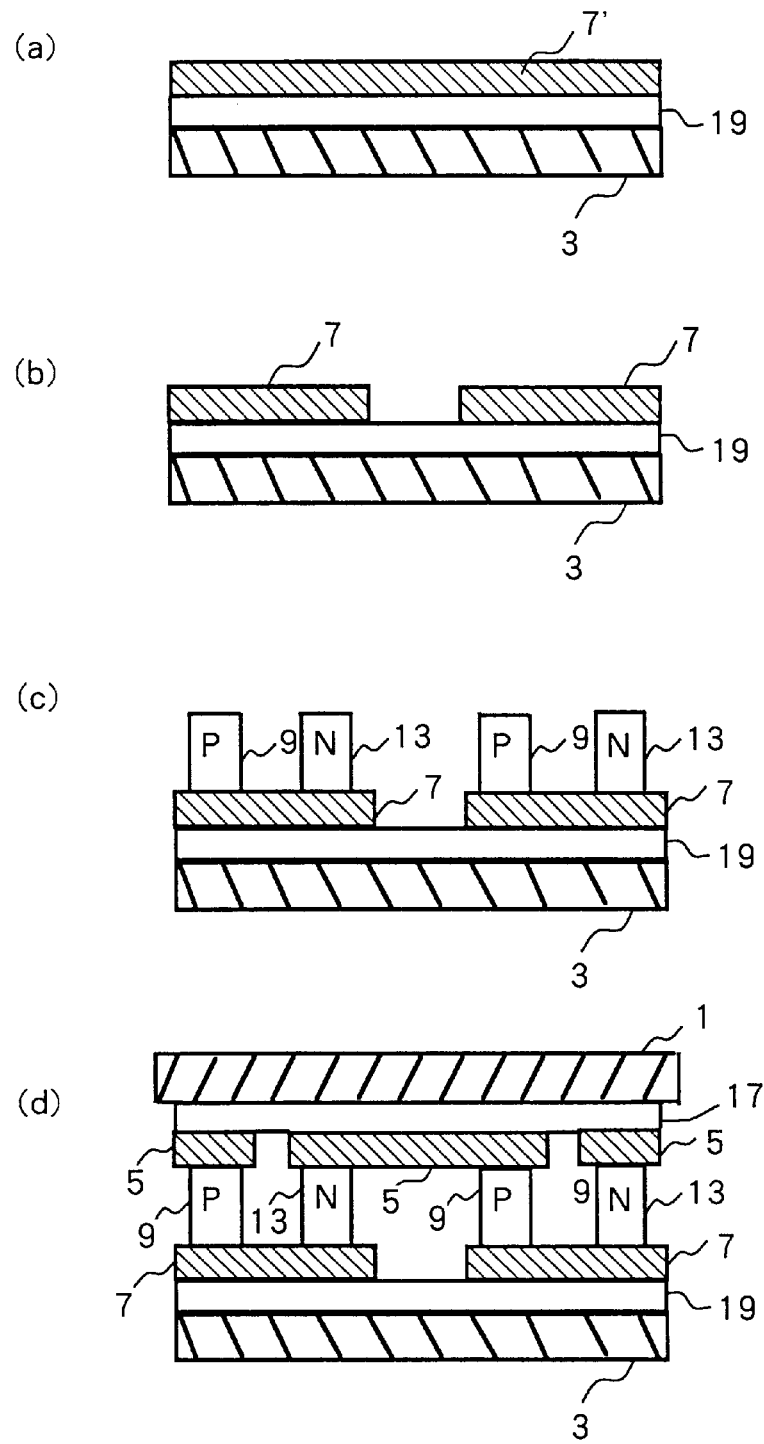
FIG. 5 illustrates a second method for manufacturing the temperature control device shown in FIG. 1.

As shown in FIG. 5(a), a broad copper foil 7' is adhered to the surface of an adhesive sheet 19 by a method such as heat pressing, and the adhesive sheet 19 is adhered to the upper surface of the cooling plate 3 by a method such as heat pressing. While it is not shown in the drawings, a broad copper foil is similarly adhered to the surface of an adhesive sheet 17, and the adhesive sheet 17 is adhered to the lower surface of the substrate mounting plate 1.

Then, as shown in FIG. 5(b), a pattern is etched into the copper foil 7' on the adhesive sheet 19, and a predetermined pattern of copper foil electrodes 7, 7, . . . is formed on the adhesive sheet 19. While it is not shown in the drawings, a pattern is similarly etched on the adhesive sheet 17 adhering to the substrate mounting plate 1, and a predetermined pattern of copper foil electrodes 5, 5, . . . is formed.

Next, p-type semiconductor elements 9, 9, . . . and n-type semiconductor elements 13, 13, . . . are soldered onto the lower copper foil electrodes 7, 7, . . . , as shown in FIG. 5(c).

Similarly, p-type semiconductor elements 9, 9, . . . and n-type semiconductor elements 13, 13, . . . are also soldered onto the lower copper foil electrodes 5, 5, . . . as shown in FIG. 5(d). This terminates the manufacturing process.

In the first manufacturing method described above, the adhesive sheets 17 and 19 to which the patterned copper foil electrodes 5, 5, . . . and 7, 7, . . . have been adhered are adhered to the substrate mounting plate 1 and the cooling plate 3 by heat pressing or the like. When, to that end, a high pressure is applied to the corners of the copper foil electrodes 5, 5, . . . and 7, 7, . . . , the adhesive sheets 17 and 19 may be damaged. Therefore it is necessary to provide the adhesive sheets 17 and 19 with a thickness that can withstand this damage.

In the second manufacturing method, on the other hand, the copper foil electrodes 5, 5, . . . and 7, 7, . . . are patterned by etching after the adhesive sheets 17 and 19 have been adhered to the substrate mounting plate 1 and the cooling plate 3, so that there is no danger of damaging the adhesive sheets 15 and 17 with the corners of the copper foil electrodes 5, 5, . . . and 7, 7, . . . , and consequently the adhesive sheets 17 and 19 can be made thinner. As a result, the thermal resistance of the adhesive sheets 17 and 19 decreases, and its thermal response improves.

With the above-described first embodiment of the present invention, the copper foil electrodes 5, 5, . . . and 7, 7, . . . serving as the heat exchange surfaces of the thermoelectric device 21 are adhered to the substrate mounting plate 1 and the cooling plate 3 using the adhesive sheets 17 and 19 that are electrically insulating and heat-resistant, like a polyimide film. Therefore, the temperature control device of this embodiment, in which the thermoelectric conversion elements 9 and 13 are distributed across substantially the entire region 400 corresponding to the substrate to be temperature-controlled (for example, a semiconductor wafer or a liquid crystal substrate), as shown in FIG. 2, has a better temperature uniformity and, since the thermal resistance between the thermoelectric conversion elements 9 and 13 and the plates 1 and 3 is small, a better thermal response than the conventional temperature control device in FIG. 3, in which a plurality of thermoelectric modules 503 whose heat exchange surfaces are ceramic plates that are sandwiched between the substrate mounting plate and the cooling plate 501 and fastened with bolts 505, 505, . . . .

This embodiment does not use bolts, which solves the problem of labor-intensive manufacturing, the danger of defects due to the burying of the bolts in the plates 1 and 3, positional misalignments of the thermoelectric modules caused by variations in the tightening degree of the individual bolts, the projecting of the thermoelectric modules from between the plates, and other deficiencies of the conventional device. Furthermore, because bolts are not used, there is no need to arrange the thermoelectric conversion elements 9 and 13 avoiding the positions of the bolts. Therefore, it is possible to arrange the thermoelectric conversion elements 9 and 13 across substantially the entire surface of the plates 1 and 3. As a result, it is possible to freely adjust the density with which the thermoelectric conversion elements 9 and 13 are arranged, so as to minimize temperature variations in the substrate 2 to be temperature-controlled, and to obtain a high temperature uniformity.

In this embodiment, copper foil electrodes 5 and 7 were used as the electrodes of the thermoelectric conversion elements 9 and 13, but it is equally possible to use aluminum foil, stainless steel foil or other conductive materials instead of copper foil. It is also possible to use plate-shaped heat pipes, that is, plates made of one or more heat pipes, for the substrate mounting plate 1. It is further possible to use the adhesive sheet 17 as the substrate mounting plate 1 (in other words, to eliminate the substrate mounting plate 1 and to place the substrate 2 on the adhesive sheet 17).

Figure 6:
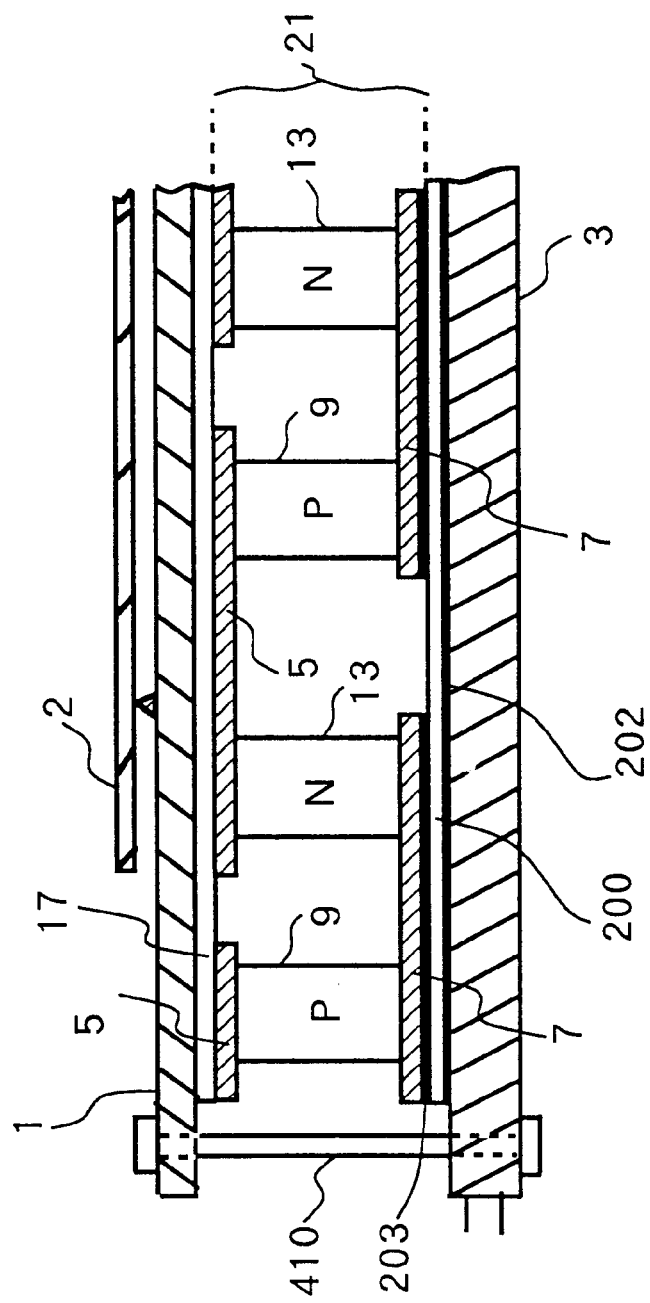
FIG. 6 shows the cross-sectional structure of a temperature control device in accordance with a second embodiment of the present invention.
Figure 7:
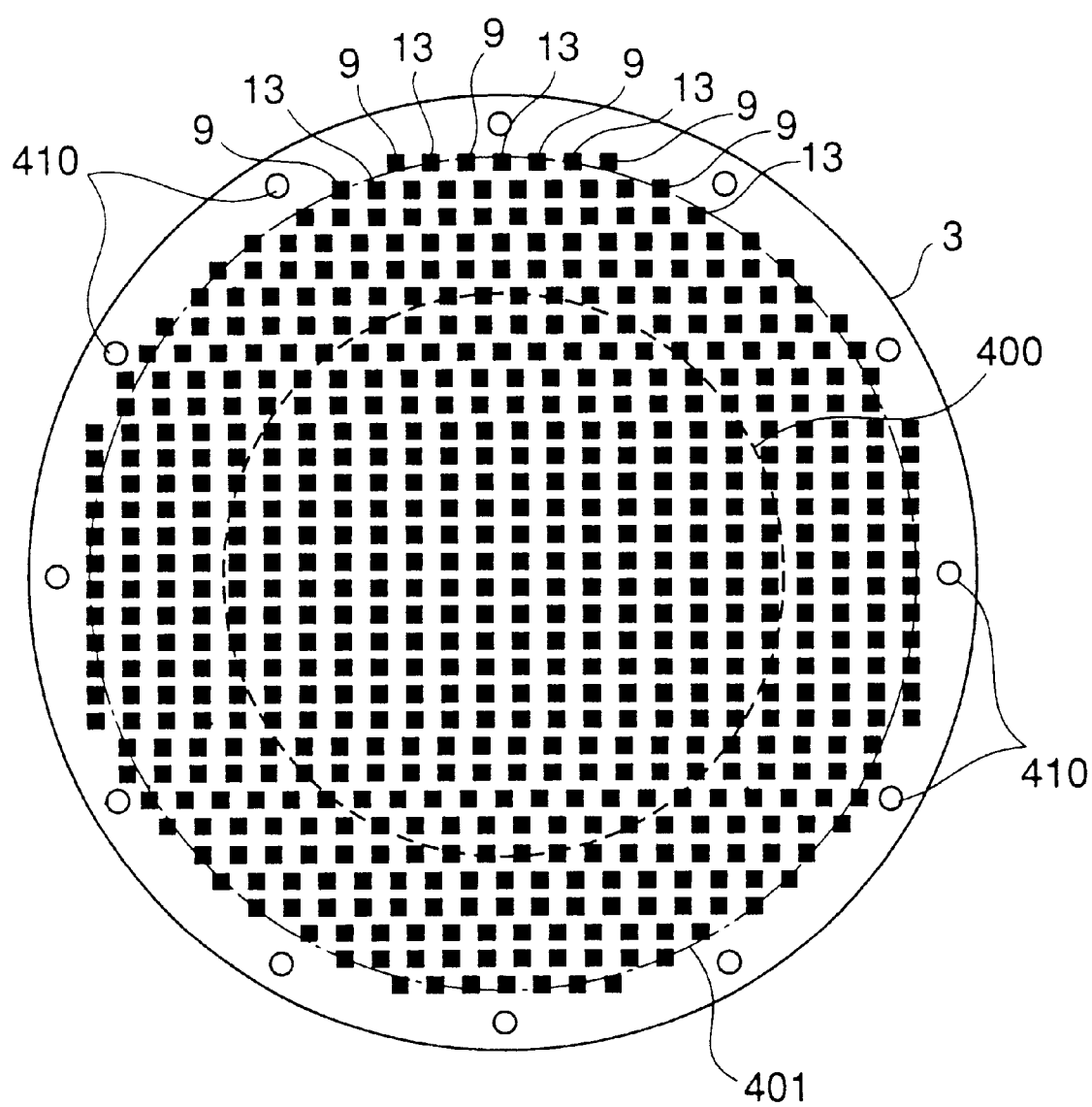
FIG. 7 is a planar view illustrating the planar arrangement of the thermoelectric conversion elements 9 and 13 of the temperature control device in FIG. 6.

FIG. 6 shows the cross-sectional structure of a temperature control device in accordance with a second embodiment of the present invention. FIG. 7 is a planar view illustrating the planar arrangement of the thermoelectric conversion elements 9 and 13 of this temperature control device. In these two drawings, elements that are functionally the same as in FIG. 1 are marked with like numerals. The same is true for all following drawings. In order to avoid duplicate explanations, the following explanations relate only to aspects that are different from FIG. 1.

In this embodiment, the substrate mounting plate 1 and the cooling plate 3 are fixed by a plurality of bolts 410 attached to their outer periphery. An insulating plate 200 made of an electrically insulating material (such as mica) is pressed by the fastening force of the bolts 410 against the entire region of the cooling plate 3, through a layer 202 of thermally conductive grease. Moreover, the lower electrodes 7, 7, . . . of the thermoelectric device 21 are pressed by the fastening force of the bolts 410 against the upper surface of the insulating plate 200, through a layer 203 of thermally conductive grease.

As in the previous embodiment, the upper electrodes 5, 5, . . . of the thermoelectric device 21 are adhered directly to the lower surface of the substrate mounting plate 1 with an adhesive sheet 17 made of polyimide or the like.

In this temperature control device, the inplane position of the upper electrodes 5, 5, . . . of the thermoelectric device 21 with respect to the substrate mounting plate 1 is fixed by adhering them to the lower surface of the substrate mounting plate 1. On the other hand, the lower electrodes 7, 7, . . . contact the upper surface of the cooling plate 3 via the layers 202 and 203 of thermally conducting grease, so that their inplane position with respect to the cooling plate 3 can change. Therefore, there will be no excessive stress acting on the thermoelectric device 21, even when thermal expansion and contraction of different size act on the substrate mounting plate 1 and the cooling plate 3. In order to attain this effect, either the upper electrodes 5, 5, . . . or the lower electrodes 7, 7, . . . of the thermoelectric device 21 should be shiftable with respect to the plates 1 or 3. On the other hand, with regard to improving the thermal response and temperature uniformity with respect to the object to be temperature-controlled, for the thermal conductivity between the thermoelectric device 21 and the plates 1 and 3, it is more important that the thermal conductivity of the substrate mounting plate 1 is high than that the thermal conductivity of the cooling plate 3 is high. Because of these considerations, in the temperature control device of this embodiment, the thermal conductivity is optimized by directly adhering the thermoelectric device 21 to the substrate mounting plate 1 with an adhesive sheet 17, and stress due to thermal expansion and contraction of the plates 1 and 3 is avoided by affording for shiftability by providing the afore-mentioned grease layers 202 and 203 between the thermoelectric device 21 and the cooling plate 3, even though this may sacrifice some thermal conductivity.

The following third embodiment is anther configuration evolving from the idea of avoiding stress due to thermal expansion and contraction.

Figure 8:
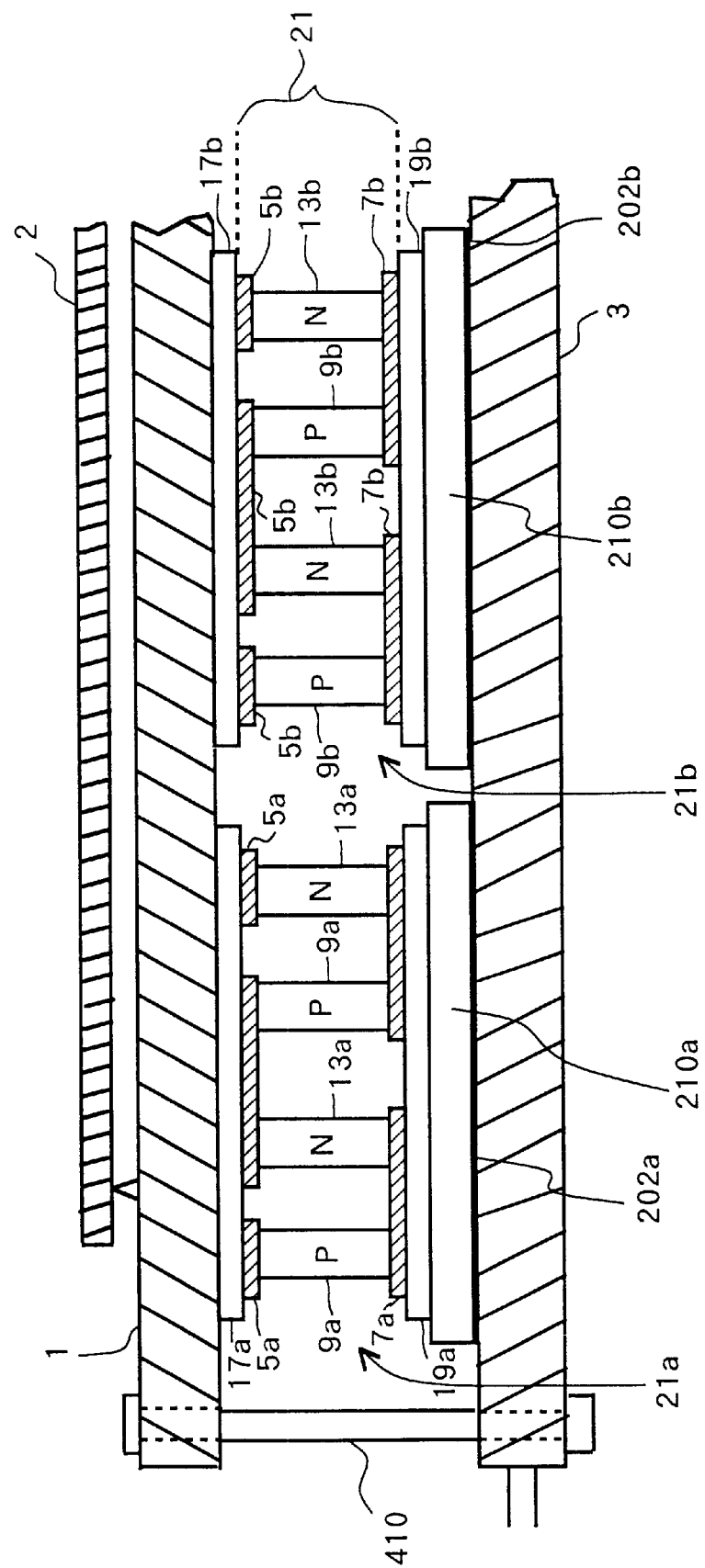
FIG. 8 shows the cross-sectional structure of a temperature control device in accordance with a third embodiment of the present invention.

FIG. 8 shows the cross-sectional structure of a temperature control device in accordance with this third embodiment of the present invention.

In this embodiment, the thermoelectric device 21 is partitioned into a plurality of blocks 21a, 21b, . . . , and the adhesive sheets 17 and 19 are partitioned correspondingly (it is also possible not to partition the upper adhesive sheet 17). Fastened between the plates 1 and 3 by bolts 410, the thermoelectric device blocks 21a, 21b, . . . are sandwiched between the plates 1 and 3 via sliding plates 210a, 210b, . . . , which are partitioned so that they can slide against one another on the cooling plate 3.

In the thermoelectric device blocks, for example in the thermoelectric device block 21a, the upper electrodes 5a, 5a, . . . are fixed directly to the lower surface of the substrate mounting plate 1 with an adhesive sheet 17a that is only for this block 21a, and the lower electrodes 7a, 7a, . . . are fixed to the upper surface of the sliding plate 210a with an adhesive sheet 19a that is only for this block 21a too. Thus, the thermoelectric device blocks 21a, 21b, . . . are structurally separate from one another.

The sliding plates 210a, 210b, . . . are pressed in a slidable fashion with the fastening force of the bolts 410 against the upper surface of the cooling plate 3, via the thermoconductive grease 202a, 202b, . . . . The sliding plates 210a, 210b, . . . can be made of an electrically insulating material, such as ceramics or mica, or, if the electrodes 7a, 7b, . . . and the cooling plate 3 are already electrically insulated from each other, for example, by the adhesive sheets 19a, 19b, . . . as shown in this drawing, they can be made of a metal, such as aluminum.

With this temperature control device, stress acting on the thermoelectric device 21 due to the thermal expansion (thermal deformation) of the plates 1 and 3 can be prevented by the sliding of the sliding plates 210a, 210b, . . . on the cooling plate 3. Furthermore, separating the thermoelectric device blocks 21a, 21b, . . . , structurally from each other makes it possible to prevent that thermal deformations occurring locally in the plates 1 and 3 propagate to other portions of the thermoelectric device 21, so that the stress acting on the thermoelectric device 21 can be suppressed to a minimum. The thermoelectric device 21 is partitioned into a plurality of blocks 21a, 21b, . . . but the shape and the size of these blocks can be selected freely, and the blocks can be fitted in a dense tile pattern, so that the thermoelectric conversion elements 9, 9, . . . and 13, 13, . . . can be distributed over the entire temperature control region 401, as shown in FIG. 7, which makes the temperature uniformity much better than in the conventional device shown in FIG. 3.

In this temperature control device, the sliding plates 210a, 210b, . . . can also be provided on the lower surface of the substrate mounting plate 1 instead of the upper surface of the cooling plate 3, or on both instead of only on one of those surfaces.

Figure 9:
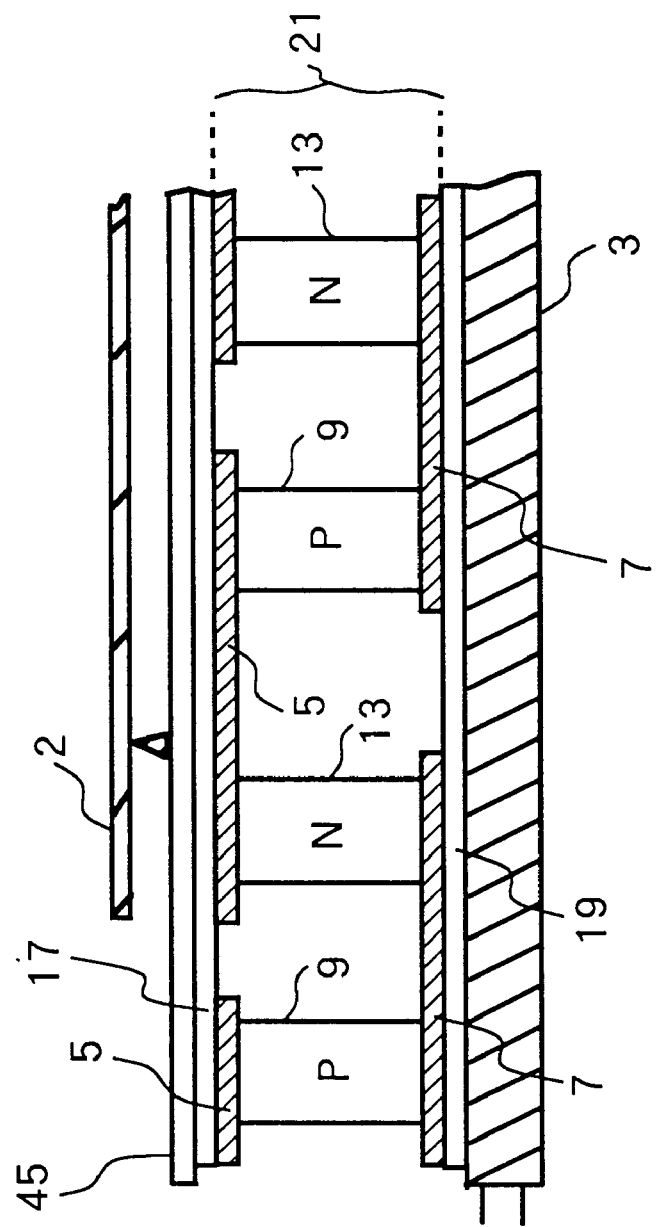
FIG. 9 shows the cross-sectional structure of a temperature control device in accordance with a fourth embodiment of the present invention.

FIG. 9 shows the cross-sectional structure of a temperature control device in accordance with a fourth embodiment of the present invention.

In this embodiment, the upper electrodes 5, 5, . . . of the thermoelectric device 21 and the adhesive sheet 17 adhered to them are covered by a thin flexible sheet (referred to as "flexible sheet" in the following) 45 made of a resin or the like (for example, of polyimide like the adhesive sheets 17 and 19), and the substrate 2 to be temperature-controlled is placed onto this flexible sheet 45. The flexible sheet 45 can be simply placed on the adhesive sheet 17, or adhered to the adhesive sheet 17. Since the adhesive sheet 17 is flexible too, it is also possible to use the adhesive sheet 17 as the flexible sheet 45 (in other words, it is possible to eliminate the flexible sheet 45 and place the substrate on the adhesive sheet 17). It is furthermore possible to apply a coating to the upper surface of the flexible sheet 45 (or the upper surface of the adhesive sheet 17) to prevent chemical influences (for example, the influence of vapor, which may be generated by the adhesive sheet 17) on the substrate 2 to be temperature-controlled.

In this embodiment, using a flexible sheet 45 as the substrate mounting plate prevents stress on the thermoelectric device 21, even when the upper and lower plates 1 and 3 are thermally deformed due to the absorption or the release of heat at the heat exchange surfaces of the thermoelectric device 21.

Figure 10:
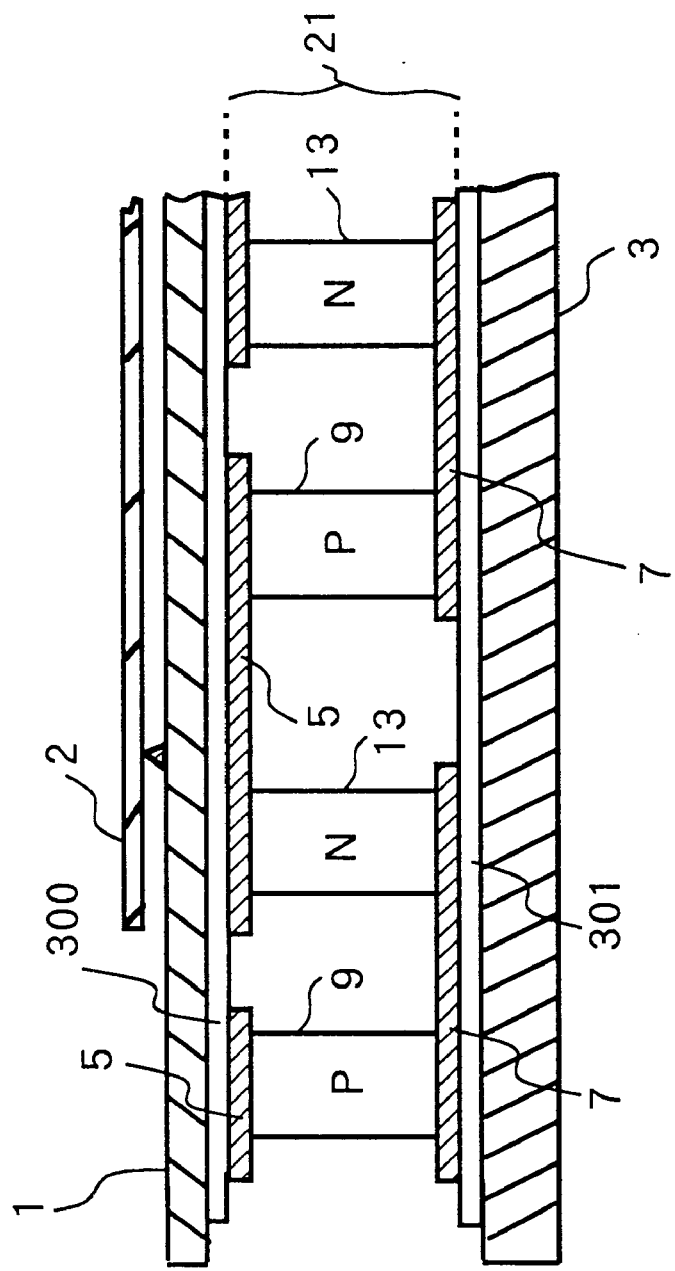
FIG. 10 shows the cross-sectional structure of a temperature control device in accordance with a fifth embodiment of the present invention.

FIG. 10 shows the cross-sectional structure of a temperature control device in accordance with a fifth embodiment of the present invention.

In this embodiment, the lower surface of the substrate mounting plate 1 and the upper surface of the cooling plate 3 are coated with films 300 and 301 that are electrically insulating, such as alumina (a ceramic material). These insulating coatings 300 and 301 can be formed, for example, by thermally spraying alumina on the surface of the plates 1 and 3. Then, the electrodes 5, 5, . . . and 7, 7, . . . of the thermoelectric device 21 are adhered directly to the surface of the insulating coatings 300 and 301 by soldering or with an adhesive, and thereby fixed to the thermoelectric device 21 between the plates 1 and 3.

In this embodiment, the same effect can be attained as in the above-described first embodiment of the present invention. In this embodiment, as in the second embodiment shown in FIGS. 6 and 7, thermally conductive grease can be arranged between the upper surface of the insulating coating 301 on the cooling plate 3 and the electrodes 7, 7, . . . , the plates 1 and 3 can be fastened with bolts, and the electrodes 7, 7, . . . can be pressed against the upper surface of the insulating coating 301 by the fastening force of the bolts. Thus, the electrodes 7, 7, . . . can slide on the insulating coating 301, so that stress acting on the thermoelectric device 21 due to thermal deformations of the plates 1 and 3 can be avoided.

Figure 11:
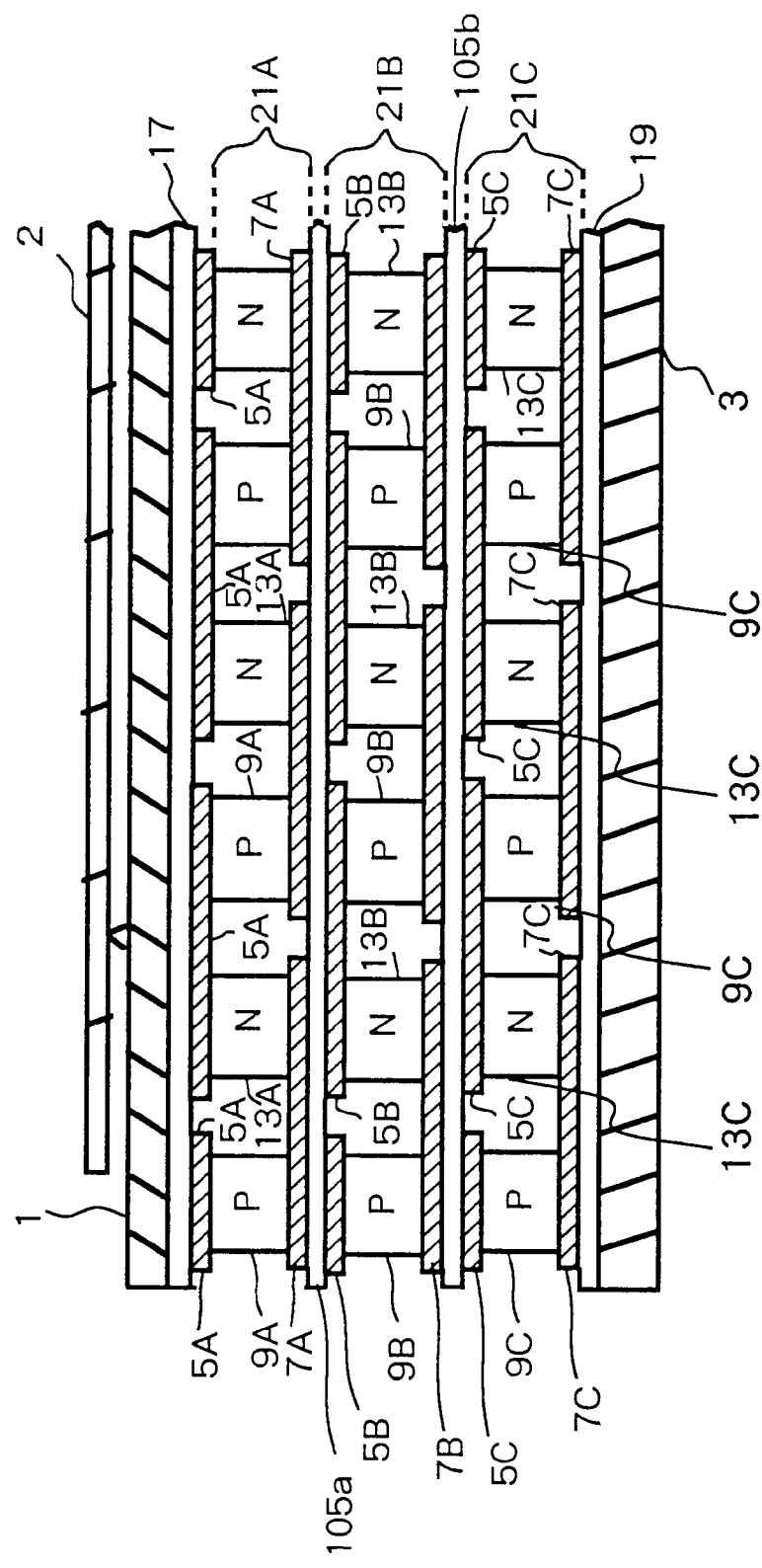
FIG. 11 shows the cross-sectional structure of a temperature control device in accordance with a sixth embodiment of the present invention.

FIG. 11 shows the cross-sectional structure of a temperature control device in accordance with a sixth embodiment of the present invention.

In this embodiment, a plurality of thermoelectric devices 21A, 21B, 21C, . . . are stacked between the plates 1 and 3, with their heat exchange surfaces aligned in series. In this drawing for example, three thermoelectric devices 21A, 21B and 21C are stacked on top of one another, but there is no limitation to three such layers.

The thermoelectric devices 21A, 21B, and 21C and the upper and lower plates 1 and 3 are all connected by directly adhering them to one another with adhesive sheets. For example, the upper heat exchange surfaces (electrodes 5A, 5A, . . . ) of the thermoelectric devices 21A of the upper layer are adhered to the lower surface of the substrate mounting plate 1 with an adhesive sheet 17, whereas the lower heat exchange surfaces (electrodes 7A, 7A, . . . ) of the thermoelectric devices 21A of the upper layer are adhered to upper heat exchange surfaces (electrodes 5B, 5B, . . . ) of the thermoelectric devices 21B in the intermediate layer with an adhesive sheet 105a. The lower heat exchange surfaces (electrodes 7B, 7B, . . . ) of the thermoelectric devices 21B of the intermediate layer are adhered to upper heat exchange surfaces (electrodes 5C, 5C, . . . ) of the thermoelectric devices 21C in the lower layer with an adhesive sheet 105b. And the lower heat exchange surfaces (electrodes 7C, 7C, . . . ) of the thermoelectric devices 21C of the lower layer are adhered to the upper surface of the cooling plate 3 with an adhesive sheet 19.

This temperature control device can be manufactured by adhering, for example, the thermoelectric device 21C, the thermoelectric device 21B, and the thermoelectric device 21A in that order on the cooling plate 3, or by first layering and adhering the thermoelectric devices 21A, 21B and 21C to one another as shown in the drawing and then sandwiching and adhering them between the plates 1 and 3.

The maximum temperature difference that can be produced between the heat exchange surfaces of the thermoelectric devices 21A, 21B and 21C is about 40° C., but by stacking the thermoelectric devices 21A, 21B and 21C with the heat exchange surfaces aligned in series, it is possible to produce a larger temperature difference (for example, 100° C. or more) between the plates 1 and 3. Consequently, the temperature of the substrate 2 to be temperature-controlled can be increased or decreased more, that is, it can be controlled over a broader temperature range. For example, it is possible to set the substrate 2 to the very low temperature of −100° C.

For the heat that is released by the thermoelectric devices 21A, 21B and 21C, the heat that is absorbed by the thermoelectric devices 21A, 21B and 21C from outside is added to the heat corresponding to the power losses inside the thermoelectric devices 21A, 21B and 21C themselves, so that the amount of heat that is released is larger than the amount of heat that is absorbed. Therefore, the thermoelectric devices that absorb heat that is released by their neighboring thermoelectric devices must have better heat absorption capabilities than their neighboring thermoelectric devices, so that they are larger. Consequently, although it is not shown in the drawings, if the temperature control device of the present invention is used to cool the substrate 2, the thermoelectric devices form pyramids, which means that the thermoelectric devices of lower layers are larger than the thermoelectric devices of upper layers, and if the temperature control device of the present invention is used to heat the substrate 2, the thermoelectric devices form inverted pyramids, which means that the thermoelectric devices of upper layers are larger than the thermoelectric devices of lower layers.

Figure 12:
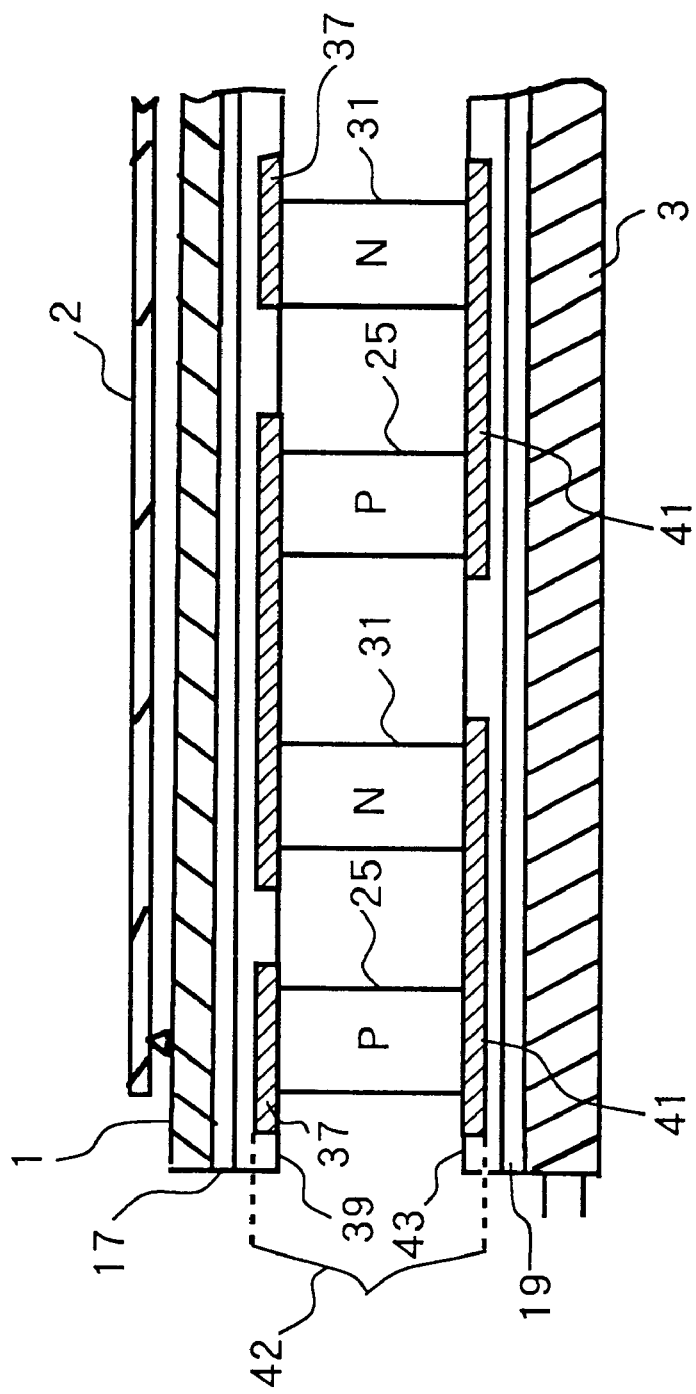
FIG. 12 shows the cross-sectional structure of a temperature control device in accordance with a seventh embodiment of the present invention.

FIG. 12 shows the cross-sectional structure of a temperature control device in accordance with a seventh embodiment of the present invention.

This embodiment has a configuration that is appropriate when the power of the thermoelectric device 42 is large, that is, when the current capacity of the thermoelectric conversion elements 25, 25, . . . and 31, 31, . . . is large (for example, about 15A). That is to say, as shown in FIG. 12, the thermoelectric conversion elements 25, 25, . . . and 31, 31, . . . are soldered to copper plate electrodes 37, 37, . . . and 41, 41, . . . having sufficient thickness (for example, 1 mm in the case of 15A) to let a sufficiently large current flow. In addition, the copper plate electrodes 37, 37, . . . and 41, 41, . . . are buried into thick insulating films 39 and 43.

For the material of the insulating films 39 and 43, it is possible to use, for example, Teflon (trademark by U.S. Dupont Corporation on tetrafluoroethylene resin). The insulating films 39 and 43 are adhered to the substrate mounting plate 1 and the cooling plate 3 by adhesive sheets 17 and 19 made of polyimide or the like. If the insulating films 39 and 43 are not only insulating but also adhesive, it is also possible to omit the adhesive sheets 17 and 19 and to adhere the insulating films 39 and 43 directly on the plates 1 and 3. By the same consideration, it is also possible to omit the insulating films 39 and 43 and to adhere the copper plate electrodes 37, 37, . . . and 41, 41, . . . on adhesive sheets 17 and 19 that are electrically insulating.

Figure 13:
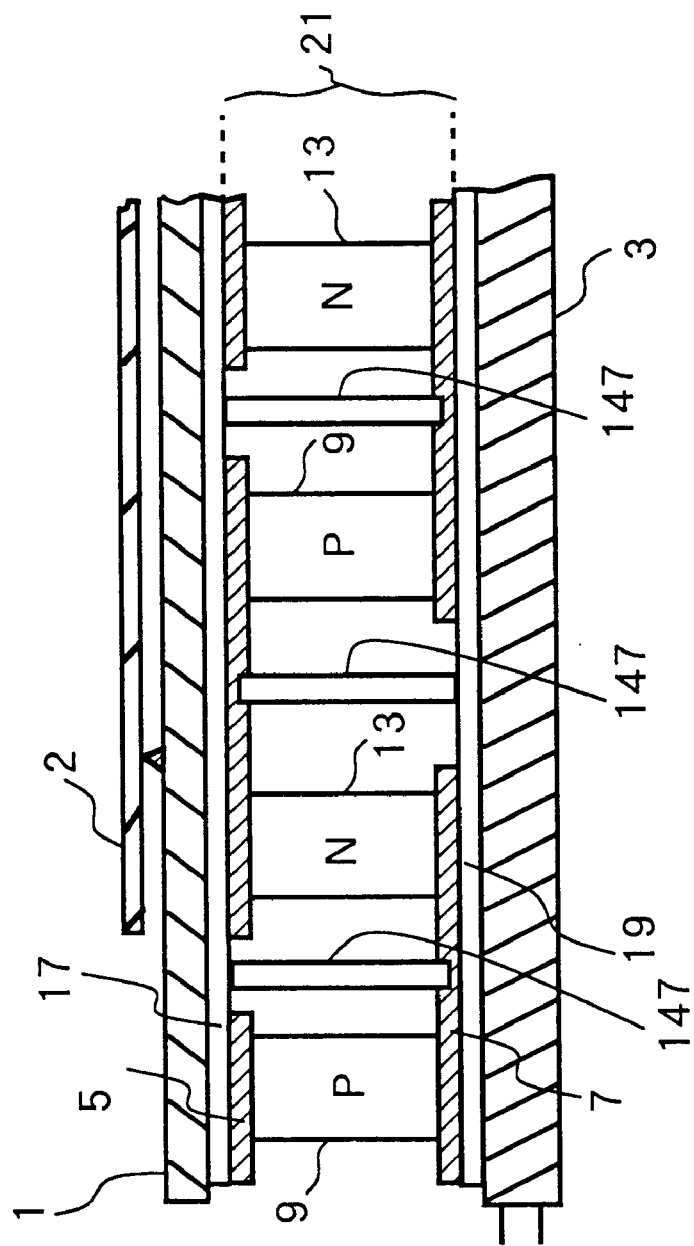
FIG. 13 shows the cross-sectional structure of a temperature control device in accordance with an eighth embodiment of the present invention.

FIG. 13 shows the cross-sectional structure of a temperature control device in accordance with an eighth embodiment of the present invention.

In this embodiment, an insulating lattice 147, which divides the thermoelectric conversion elements 9, 9, . . . and 13, 13, . . . , the upper electrodes 5, 5, . . . , and the lower electrodes 7, 7, . . . into compartments, is provided between the plates 1 and 3. The insulating lattice 147 is made of an electrically insulating material, and provides walls in the gaps between the thermoelectric conversion elements 9, 9, . . . and 13, 13, . . . in the thermoelectric device 21. These walls reinforce the thermoelectric conversion elements 9, 9, . . . and 13, 13, . . . sandwiched between the plates 1 and 3 and ensure the electric insulation between neighboring thermoelectric conversion elements 9, 9, . . . and 13, 13, . . . , as well as between neighboring copper foil electrodes 5, 5, . . . and 7, 7, . . . .

Figure 14:
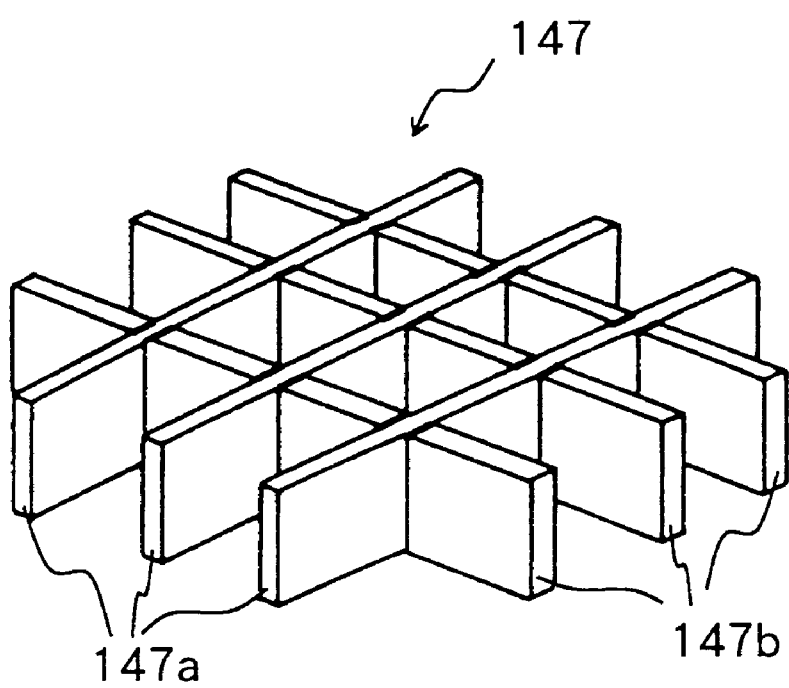
FIG. 14 is a perspective view showing an example of the overall configuration of the insulating lattice 147.

FIG. 14 is a perspective view showing an example of the overall configuration of the insulating lattice 147.

The insulating lattice 147 is configured, for example, by arranging a plurality of strip-shaped members 147*a* and 147*b* made of an electrically insulating material vertically and horizontally. That is to say, a plurality of strip-shaped members 147*a* is arranged in parallel at substantially equal spacings, another plurality of strip-shaped members 147*b* is also arranged in parallel at substantially equal spacings, and then the two groups of strip-shaped members are combined at right angles, thereby forming the insulating lattice 147, which is compartmentalized into a multitude of rectangular solid-shaped spaces as shown in FIG. 14.

In the manufacturing process for the thermoelectric device 21, this insulating lattice 147 is placed on the adhesive sheet 17 adhered to the patterned copper foil electrodes 5, 5, . . . (or on the adhesive sheet 19 adhered to the copper foil electrodes 7, 7, . . . ), so that the multitude of thermoelectric conversion elements 9, 9, . . . and 13, 13, . . . can be positioned precisely and the insulating lattice 147 functions as a jig for attaching the thermoelectric conversion elements with high efficiency.

Then, after the thermoelectric conversion elements 9, 9, . . . and 13, 13, . . . have been soldered to the copper foil electrodes 5, 5, . . . and 7, 7, . . . , the insulating lattice 147 is left standing between the plates 1 and 3, as shown in FIG. 13, so that the insulating lattice 147 functions as a reinforcing material and improves the reliability of the electrical insulation between neighboring thermoelectric conversion elements 9, 9, . . . and 13, 13, . . . as well as between neighboring copper foil electrodes 5, 5, . . . and 7, 7, . . . , as described above.

As mentioned above, the insulating lattice 147 can function as a jig for attaching the thermoelectric conversion elements, but other contrivances are also conceivable as jigs for attaching the thermoelectric conversion elements.

Figure 15:
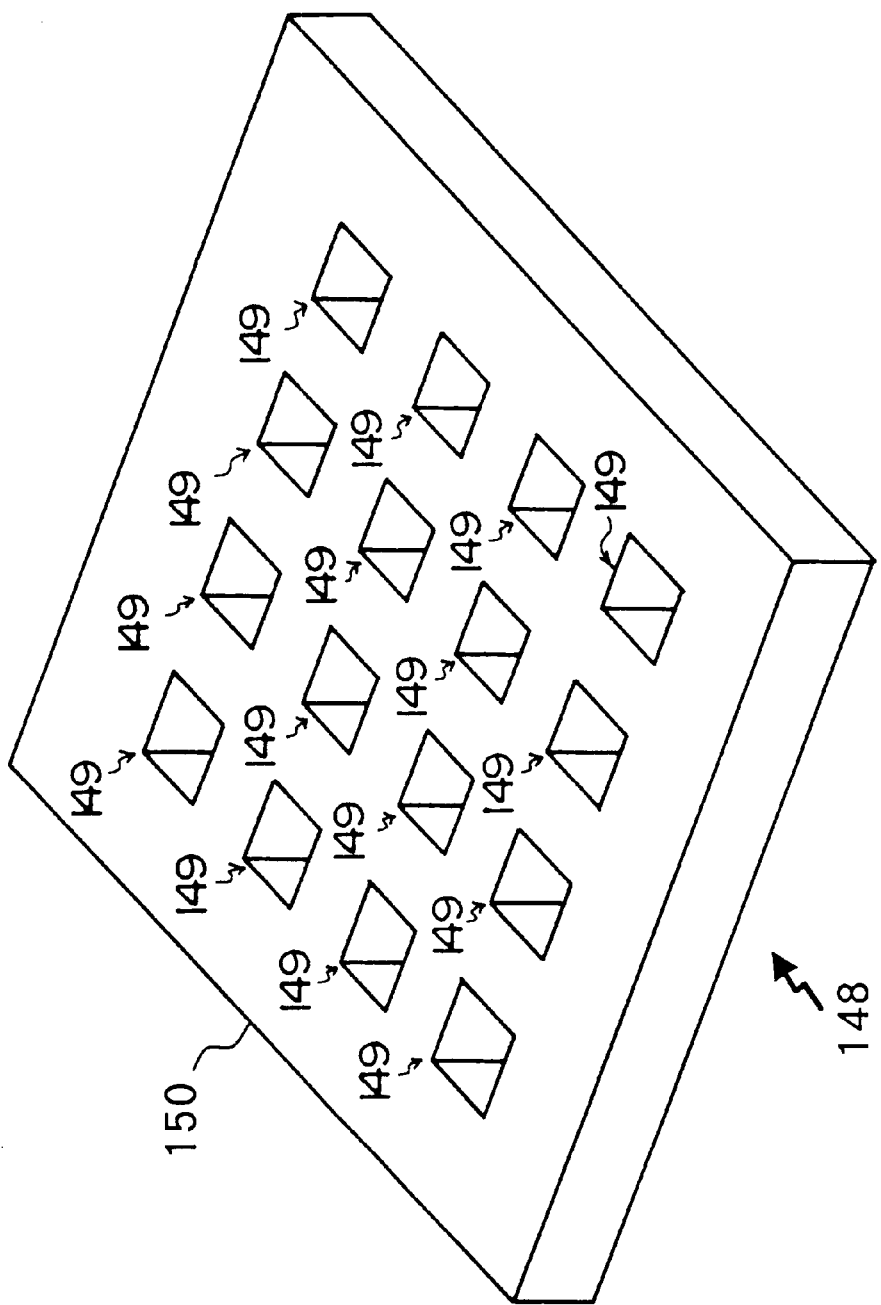
FIG. 15 is a complete perspective view showing a first example of a jig for attaching the thermoelectric conversion elements.

FIG. 15 is a complete perspective view showing a first example of a jig for attaching the thermoelectric conversion elements.

In the jig 148 shown in FIG. 15, a multitude of rectangular through holes 149, 149, . . . corresponding to the locations of the thermoelectric conversion elements 9, 9, . . . and 13, 13, . . . is provided on one plate 150 made of an electrically insulating material.

This jig 148 is used in the manufacturing process for the temperature control device in the same manner as the insulating lattice 147 shown in FIGS. 13 and 14. Furthermore, by leaving the jig 148 between the plates 1 and 3, it functions as a reinforcement material, like the insulating lattice 147, and improves the reliability of the electrical insulation between neighboring thermoelectric conversion elements 9, 9, . . . and 13, 13, . . . as well as between neighboring copper foil electrodes 5, 5, . . . and 7, 7, . . . , as described above.

Figure 16:
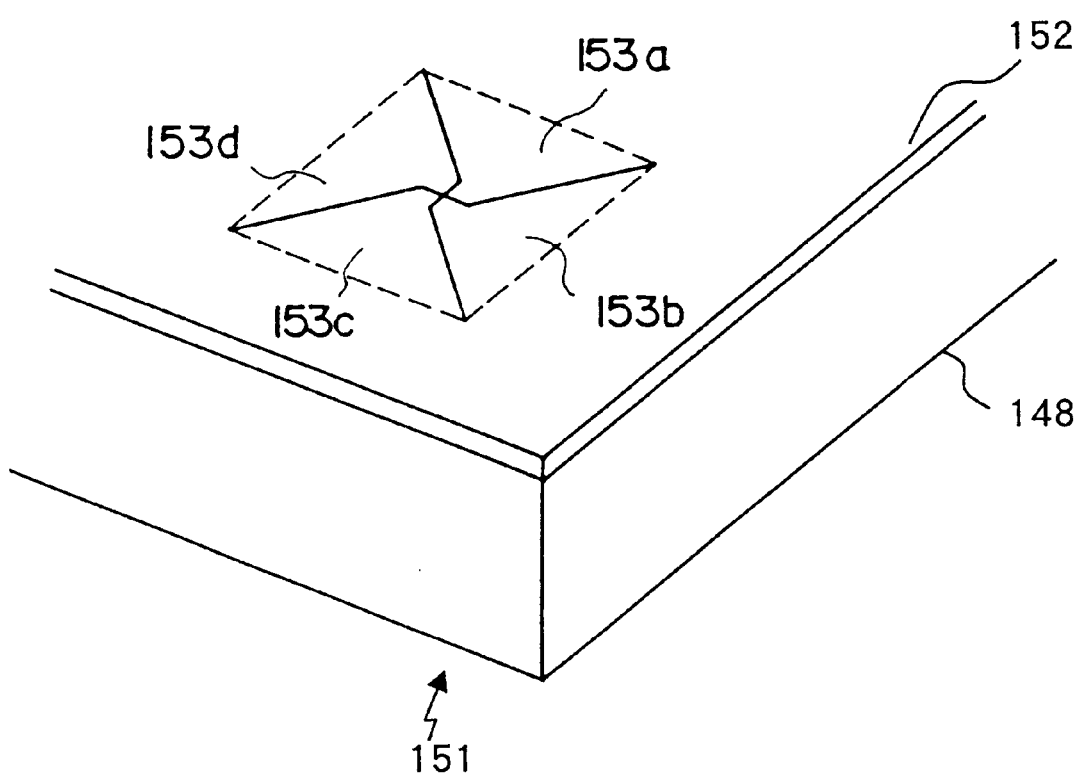
FIG. 16 is a partial perspective view showing a second example of a jig for attaching the thermoelectric conversion elements.

FIG. 16 is a partial perspective view showing a second example of a jig for attaching the thermoelectric conversion elements.

Figure 17:
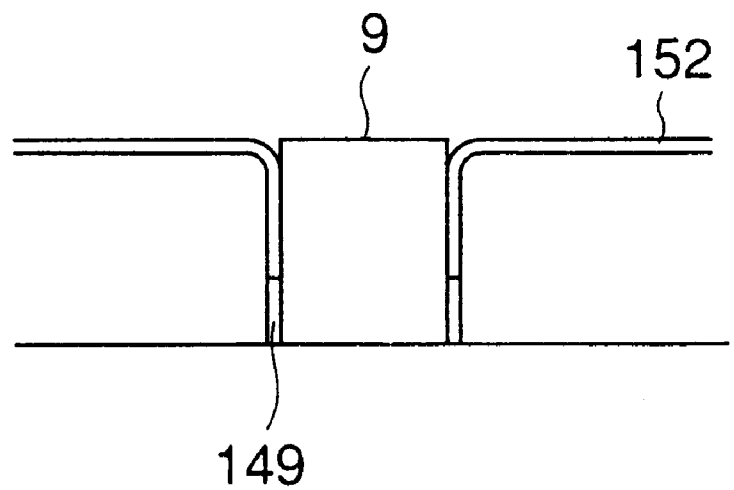
FIG. 17 is a cross-sectional view illustrating how the thermoelectric conversion elements 9 and 13 are set into the through holes 149.

In the jig 151 shown in FIG. 16, an insulating sheet 152 made of an electrically insulating material covers the upper surface of the jig 148 shown in FIG. 15, and this insulating sheet 152 is provided with cut-out pieces 153*a* to 153*d* in the through holes (see FIG. 15) for setting the thermoelectric conversion elements 9 and 13 provided at various locations in the jig 151, so that it is possible to set the thermoelectric conversion elements 9 and 13. As shown in FIG. 17, the cut-out pieces 153*a* to 153*d* are folded into the through holes 149 when setting the thermoelectric conversion elements 9 and 13, and guide the thermoelectric conversion elements 9 (or 13) within the through holes 149, and fill the gaps between the thermoelectric conversion elements 9 (or 13) and the through holes 149. Thus, it is possible to reliably prevent positional misalignments of the thermoelectric conversion elements 9 and 13, that may occur during the manufacturing process of the temperature control device due to the gaps between the thermoelectric conversion elements 9, 13 and the through holes 149, 149, . . . .

Figure 18:
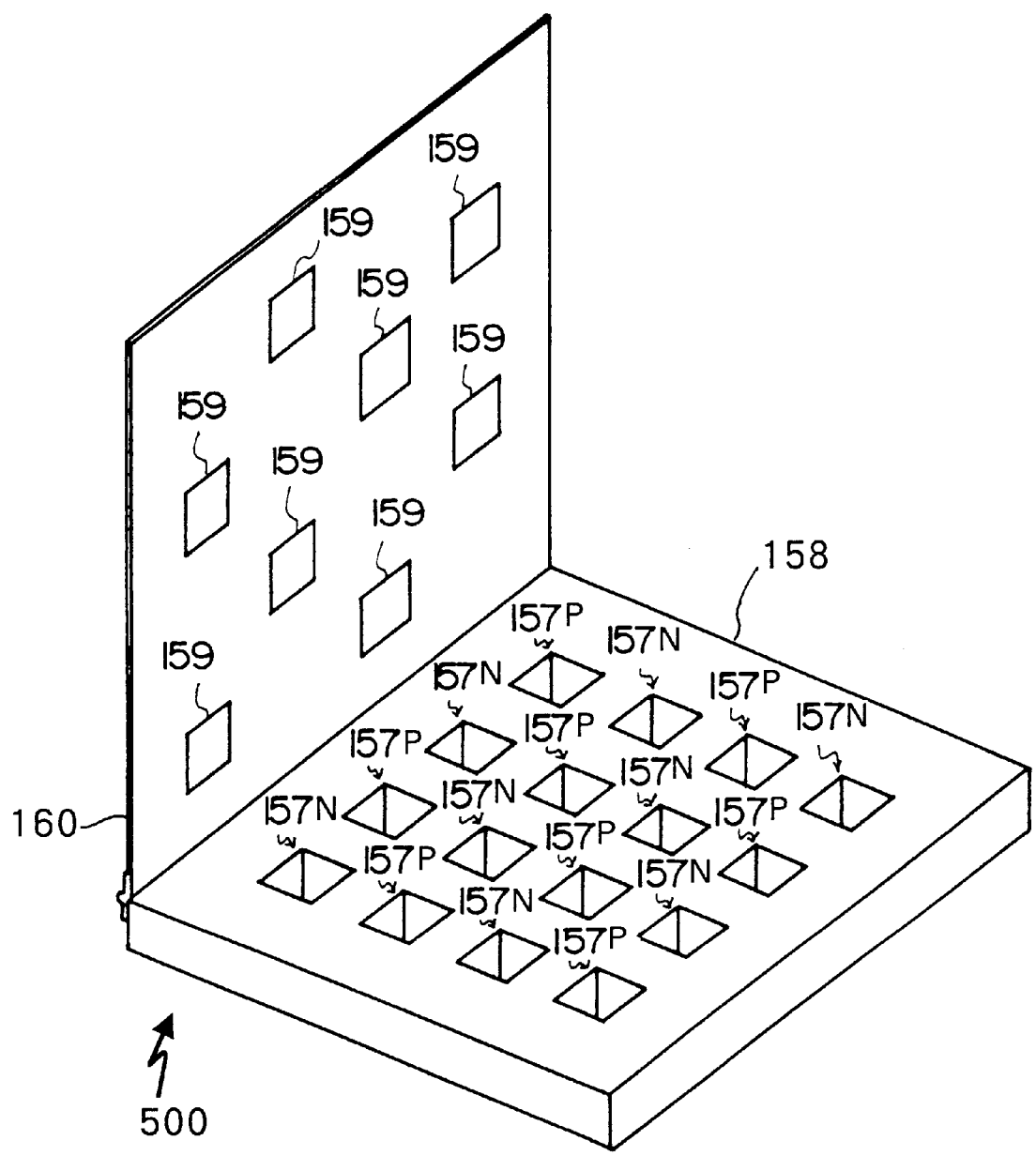
FIG. 18 is a complete perspective view showing a third example of a jig for attaching the thermoelectric conversion elements.
Figure 19:
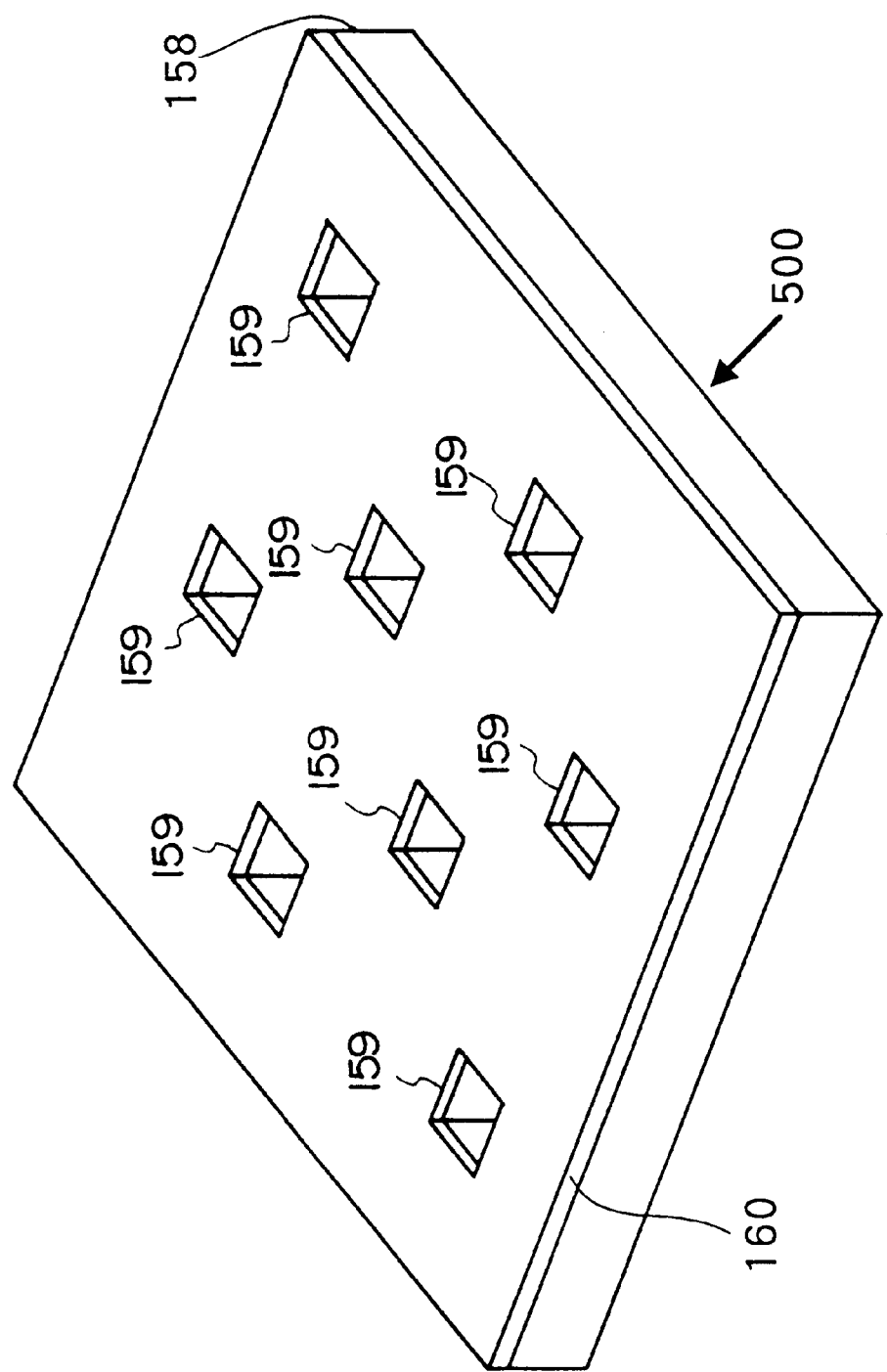
FIG. 19 is a complete perspective view showing the third example of a jig for attaching the thermoelectric conversion elements when the lid 160 is closed.

FIGS. 18 and 19 are complete perspective views showing a third example of a jig for attaching the thermoelectric conversion elements.

The jig 500 in FIGS. 18 and 19 includes a jig board 158, and a lid 160 coupled in closable fashion to the jig board 158. The jig board 158, made of an electrically insulating material, is provided with a multitude of rectangular through holes 157P, 157P, . . . corresponding to the locations of the p-type thermoelectric semiconductor elements 9, 9, . . . , and a multitude of rectangular through holes 157N, 157N, . . . corresponding to the locations of the n-type thermoelectric semiconductor elements 13, 13, . . . . On the other hand, the lid 160 is provided with rectangular through holes 159, 159, . . . corresponding to the locations of only one type of thermoelectric conversion elements, for example the p-type thermoelectric semiconductor elements 9, 9, . . . , that is, corresponding to only the through holes 157P, 157P, . . . of the jig board 158.

That is to say, when placing the thermoelectric conversion elements 9 and 13 onto the copper foil electrodes 5 and 7 (or the copper plate electrodes 37 and 41) with this jig 500, first, the lid 160 is closed as shown in FIG. 19 to conceal the through holes 157N, 157N, . . . for the placement of the n-type thermoelectric semiconductor elements 13, 13, . . . in the jig board 158, and only the p-type thermoelectric semiconductor elements 9, 9, . . . are set into the open through holes 159, 159, . . . (that is, the through holes 157P, 157P, . . . in the jig board 158). Then, the lid 160 is opened, and the n-type thermoelectric semiconductor elements 13, 13, . . . are set into the remaining through holes 157N, 157N, . . . .

Thus, the locations of the thermoelectric conversion elements 9 and 13 cannot be confounded so that it is possible to place the thermoelectric conversion elements 9 and 13 quickly and precisely into their predetermined positions, which contributes to the efficient manufacture of the temperature control device.

In the foregoing, several preferable embodiments of the present invention have been described, but it should be understood that these are merely illustrative examples of the present invention, and that the scope of the present invention is in no way limited to these examples. The present invention can be embodied by many different variations. For example, in the second embodiment shown in FIG. 6, it is also possible to form the insulating film by spraying alumina or the like on the cooling plate 3 and to press the electrodes 7, 7, . . . via the thermally conductive grease 203 with the fastening force of the bolts 410 against the surface of this insulating film. Furthermore, in the sixth embodiment shown in FIG. 11, it is possible to use a thin sheet, made of resin or the like, for the substrate mounting plate. Furthermore, in the second to sixth and eighth embodiments, if copper plates with sufficient thickness for large currents are used then these embodiments can also be used in cases in which the power of the thermoelectric device is large. Moreover, the electrodes 5 and 7 are not limited to copper, and it is, of course, also possible to use other metals, such as stainless steel.

What is claimed is:

1. A temperature control device comprising:
   a mounting plate for mounting an object to be temperature-controlled;
   a heat exchange plate for the exchange of heat;
   a heat exchange device having a multitude of thermoelectric conversion elements that are sandwiched between said two plates and arranged in two-dimensional arrangement, and a multitude of electrodes that are electrically connected to the thermoelectric conversion elements and that constitute heat exchange surfaces on both sides thereof;
   wherein said multitude of thermoelectric conversion elements is distributed across substantially an entire temperature control region that covers the region corresponding to the object to be temperature-controlled that is mounted on the mounting plate,
   wherein the electrical connections among said multitude of thermoelectric elements in said substantially entire temperature control region are solely made by said multitude of electrodes which constitute the heat exchange surfaces.

2. The temperature control device of claim 1, wherein all of the thermoelectric conversion elements included in the heat exchange device are connected electrically in series.

3. The temperature control device of claim 1, wherein the electrodes are made of metal foil.

4. The temperature control device of claim 1, wherein said electrodes constituting the heat exchange surfaces on at least one side of the heat exchange device are fixed to the mounting plate or the heat exchange plate with an adhesive.

5. The temperature control device of claim 4, wherein the adhesive is electrically insulating, and wherein said electrodes constituting the heat exchange surfaces on at least one side of the heat exchange device are directly adhered to the mounting plate or the heat exchange plate with the adhesive.

6. The temperature control device of claim 4 or 5, wherein the total thickness of the adhesive and the electrodes on the side that is fixed with the adhesive is approximately 25 to 1000 μm.

7. A temperature control device comprising:
   a mounting plate for mounting an object to be temperature-controlled;
   a heat exchange plate for the exchange of heat;
   a heat exchange device having a multitude of thermoelectric conversion elements that are sandwiched between said two plates and arranged in a two-dimensional arrangement, and a multitude of electrodes that are electrically connected to the thermoelectric conversion elements and that constitute heat exchange surfaces on both sides thereof;
   wherein said multitude of thermoelectric conversion elements is distributed across substantially an entire temperature control region that covers the region corresponding to the object to be temperature-controlled that is mounted on the mounting plate, and
   wherein the surface of the mounting plate or the heat exchange plate is coated with an insulating material, and the heat exchange surfaces on at least one side of the heat exchange device are adhered to the coated surface.

8. A temperature control device comprising:
   a mounting plate for mounting an object to be temperature-controlled;
   a heat exchange plate for the exchange of heat;
   a heat exchange device having a multitude of thermoelectric conversion elements that are sandwiched between said two plates and arranged in a two-dimensional arrangement, and a multitude of electrodes that are electrically connected to the thermoelectric conversion elements and that constitute heat exchange surfaces on both sides thereof;
   wherein said multitude of thermoelectric conversion elements is distributed across substantially an entire temperature control region that covers the region corresponding to the object to be temperature-controlled that is mounted on the mounting plate, and wherein the heat exchange surfaces on one side of the heat exchange device are attached in a slidable manner to the mounting plate or the heat exchange plate, and the heat exchange surfaces on the other side of the heat exchange device are fixed to the mounting plate or the heat exchange plate.

9. The temperature control device of claim 8, wherein the heat exchange surfaces on the other side are directly adhered to the mounting plate or the heat exchange plate with an adhesive that is electrically insulating.

10. A temperature control device comprising:

a mounting plate for mounting an object to be temperature-controlled;

a heat exchange plate for the exchange of heat;

a heat exchange device having a multitude of thermoelectric conversion elements that are sandwiched between said two plates and arranged in a two-dimensional arrangement, and a multitude of electrodes that are electrically connected to the thermoelectric conversion elements and that constitute heat exchange surfaces on both sides thereof;

wherein said multitude of thermoelectric conversion elements is distributed across substantially an entire temperature control region that covers the region corresponding to the object to be temperature-controlled that is mounted on the mounting plate, and wherein the mounting plate is a flexible sheet.

11. The temperature control device of claim 1, wherein a plurality of the heat exchange devices are stacked one upon the other with the heat exchange surfaces arranged in series.

12. The temperature control device of claim 11, wherein the plurality of the heat exchange devices are adhered to one another with an electrically insulating adhesive.

13. The temperature control device of claim 1, further comprising a reinforcement material provided between the mounting plate and the heat exchange plate, said reinforcement material being configured to separate neighboring thermoelectric conversion elements from each other.

14. The temperature control device of claim 1, further comprising a duct for cooling water inside the heat exchange plate.

15. The temperature control device of claim 1, wherein the mounting plate is a heat plate provided with one or more heat pipes.

16. A method for manufacturing a temperature control device comprising a mounting plate for mounting an object to be temperature-controlled; a heat exchange plate for the exchange of heat; a heat exchange device having a multitude of thermoelectric conversion elements that are sandwiched between said two plates and arranged in a two-dimensional arrangement, and a multitude of electrodes that are electrically connected to the thermoelectric conversion elements and that constitute heat exchange surfaces on both sides thereof; wherein said multitude of thermoelectric conversion elements is distributed across substantially an entire temperature control region that covers the region corresponding to the object to be temperature-controlled that is mounted on the mounting plate; the method comprising:

a first step of preparing an adhesive sheet, on whose surface a metal foil has been adhered;

a second step following the first step, in which a pattern is etched into the metal foil on the surface of the adhesive sheet, so as to form electrodes having a predetermined wiring pattern;

a third step following the second step, in which the adhesive sheet is adhered to one surface of the mounting plate or the heat exchange plate; and a fourth step following the second step, in which the thermoelectric conversion elements are joined to predetermined positions on the metal foil electrodes.

17. A method for manufacturing a temperature control device comprising a mounting plate for mounting an object to be temperature-controlled; a heat exchange plate for the exchange of heat; a heat exchange device having a multitude of thermoelectric conversion elements that are sandwiched between said two plates and arranged in a two-dimensional arrangement, and a multitude of electrodes that are electrically connected to the thermoelectric conversion elements and that constitute heat exchange surfaces on both sides; wherein said multitude of thermoelectric conversion elements is distributed across substantially an entire temperature control region that covers the region corresponding to the object to be temperature-controlled that is mounted on the mounting plate; the method comprising:

a first step of preparing an adhesive sheet, on whose surface a metal foil has been adhered;

a second step of adhering the adhesive sheet to one surface of the mounting plate or the heat exchange plate;

a third step following the first step and the second step, in which a pattern is etched into the metal foil on the adhesive sheet, so as to form electrodes having a predetermined pattern on the adhesive sheet; and a fourth step following the third step, in which the thermoelectric conversion elements are connected to predetermined positions on the metal foil electrodes.

* * * * *